US011918048B2

United States Patent
Ma

(10) Patent No.: US 11,918,048 B2
(45) Date of Patent: Mar. 5, 2024

(54) ELECTRONIC ATOMIZATION DEVICE AND CONTROL CIRCUIT THEREOF

(71) Applicant: Hangzhou Sungod Semiconductor Co., Ltd., Zhejiang (CN)

(72) Inventor: Meifang Ma, Zhejiang (CN)

(73) Assignee: HANGZHOU SUNGOD SEMICONDUCTOR CO., LTD., Zhejiang (CN)

(*) Notice: Subject to any disclaimer, the term of this patent is extended or adjusted under 35 U.S.C. 154(b) by 0 days.

(21) Appl. No.: 17/267,381

(22) PCT Filed: Oct. 30, 2020

(86) PCT No.: PCT/CN2020/125344
§ 371 (c)(1),
(2) Date: Feb. 9, 2021

(87) PCT Pub. No.: WO2021/243944
PCT Pub. Date: Dec. 9, 2021

(65) Prior Publication Data
US 2023/0070749 A1 Mar. 9, 2023

(30) Foreign Application Priority Data

May 30, 2020 (CN) .......................... 202010482441.5
May 30, 2020 (CN) .......................... 202010482619.6
(Continued)

(51) Int. Cl.
*A24F 40/50* (2020.01)
*A24F 40/60* (2020.01)
(Continued)

(52) U.S. Cl.
CPC .............. *A24F 40/50* (2020.01); *A24F 40/60* (2020.01); *H02J 7/0048* (2020.01); *H02J 7/345* (2013.01);
(Continued)

(58) Field of Classification Search
None
See application file for complete search history.

(56) References Cited

U.S. PATENT DOCUMENTS

| 10,004,269 | B2* | 6/2018 | Xiang | ................. G01R 31/371 |
| 2015/0136157 | A1 | 5/2015 | Liu | |
| 2015/0173124 | A1* | 6/2015 | Qiu | ......................... A24F 40/60 131/328 |

FOREIGN PATENT DOCUMENTS

| CN | 203952417 U | 11/2014 |
| CN | 209284325 U | 8/2019 |

(Continued)

*Primary Examiner* — Tho D Ta
(74) *Attorney, Agent, or Firm* — CANTOR COLBURN LLP

(57) ABSTRACT

An electronic atomization device and a control circuit therefor are provided. The control circuit includes an airflow sensor, a power supply capacitor and a control chip including a logic controller, a unidirectional conduction tube and a switch tube, a power supply pin, an atomization pin and a ground pin; the logic controller is connected to a first end of the airflow sensor and a first end of the switch tube; and through the power supply pin, is connected to a first end of the power supply capacitor and a second end of the switch tube; and through the ground pin, is connected to a positive electrode of the unidirectional conduction tube, a second end of the airflow sensor and a second end of the power supply capacitor; a negative electrode of the unidirectional conduction tube, through the atomization pin, is connected to a third end of the switch tube.

20 Claims, 8 Drawing Sheets

(30) Foreign Application Priority Data

May 30, 2020 (CN) .......................... 202020962295.1
May 30, 2020 (CN) .......................... 202020964588.3

(51) Int. Cl.
*H02J 7/00* (2006.01)
*H02J 7/34* (2006.01)
*H05B 45/325* (2020.01)

(52) U.S. Cl.
CPC ........ H05B 45/325 (2020.01); *H02J 2207/20* (2020.01)

(56) References Cited

FOREIGN PATENT DOCUMENTS

| | | | |
|---|---|---|---|
| CN | 209284326 U | 8/2019 | |
| CN | 111557475 A | 8/2020 | |
| CN | 111588094 A | 8/2020 | |
| WO | WO-2019033887 A1 * | 2/2019 | ........... A24F 47/008 |

* cited by examiner

ELECTRONIC ATOMIZATION DEVICE AND CONTROL CIRCUIT THEREOF

CROSS REFERENCE TO THE RELATED APPLICATIONS

This application is the national phase entry of International Application No. PCT/CN2020/125344, filed on Oct. 30, 2020, which is based upon and claims priority to Chinese Patent Application No. 202010482619.6, Chinese Utility Model Patent Application No. 202020964588.3, Chinese Patent Application No. 202010482441.5 and Chinese Utility Model Patent Application No. 202020962295.1 filed on May 30, 2020, the entire contents each of which are incorporated herein by reference.

TECHNICAL FIELD

The present application relates to the technical field of electronic atomization, and more particularly to an electronic atomization device and its control circuit and control method.

BACKGROUND

With the increasing awareness of people's health and environmental protection, more and more users are choosing to use electronic atomization devices (for example, using electronic cigarettes as a substitute for cigarettes), and the market for electronic atomization devices is also growing. To gain an advantage in fierce market competition, product quality and production cost of electronic atomization devices are issues that manufacturers need to consider.

Nowadays, in the manufacturing process of electronic atomization devices, manufacturers of chip design usually assemble control chips, PCB boards and peripheral components into modules for sale, while manufacturers of actual electronic product need to assemble the modules with batteries, atomization wires and casings to product complete electronic atomizing devices for the market. FIG. 1 shows a schematic diagram of a connection relationship between a control circuit A, a battery S0 and an atomization wire R0 of the electronic atomization device in related arts. As shown in FIG. 1, the control circuit A includes a voltage stabilizing capacitor C0, an airflow sensor K0, and a control chip A1. In production, welding leads are usually necessary at three pins of the control chip A1 (i.e., VDD pin, AT pin and GND pin) to realize the connection relationship between the control circuit A, the power supply S0 and the atomization wire R0, thereby achieving a power supply and an operation of the electronic atomization device.

However, due to the size limitation of the electronic atomization device, the size of PCB board of the electronic atomization device is smaller, the welding leads are thinner, and usually require manual welding. Therefore, if there are more leads to be welded, the higher the production cost of the electronic atomization devices and the lower the reliability of product quality will be. As such, in the production process of the electronic atomization devices of the related arts, there are problems of high production cost and low reliability.

Technical Problem

One of the objects of the embodiments of the present application is to provide an electronic atomization device and its control circuit and control method, which can solve the problems of high production cost and low reliability due to the large number of leads that need to be welded in the production process of the electronic atomization device of the related art.

Technical Solutions

In order to solve the above technical problems, technical solutions are provided by embodiments of the present application as follows:

In accordance with a first aspect of the present application, it is provided a control circuit, including an airflow sensor, a power supply capacitor and a control chip. The control chip includes a logic controller, a unidirectional conduction tube and a switch tube, a power supply pin, an atomizing pin and a ground pin.

In which, the logic controller is connected to a first end of the airflow sensor and a first end of the switch tube; the logic controller, through the power supply pin, is connected to a first end of the power supply capacitor and a second end of the switch tube; the logic controller, through the ground pin, is connected to a positive electrode of the unidirectional conduction tube, a second end of the airflow sensor and a second end of the power supply capacitor; and a negative electrode of the unidirectional conduction tube, through the atomizing pin, is connected to a third end of the switch tube;

In which, the power supply pin and the atomization pin of the control chip are configured to connect with peripheral power supply module and atomization module to achieve an electronic atomization function. That is, the power supply module and the atomization module are controlled by the control chip to form a current path to achieve the electronic atomization function.

In accordance with a second aspect of the present application, it is provided an electronic atomization device, including a power supply module, an atomization module and the control circuit as described in the first aspect;

In which, a positive electrode of the power supply module is connected to the power supply pin of the control chip, a negative electrode of the power supply module, through the atomization module, is connected to the atomization pin of the control chip, and the negative electrode of the power supply module is grounded;

Alternatively, the positive electrode of the power supply module, through the atomization module, is connected to the power supply pin of the control chip, the negative electrode of the power supply module is connected to the atomization pin of the control chip, and the negative electrode of the power supply module is grounded.

In accordance with a third aspect of the present application, it is provided a control circuit, including an airflow sensor, a power supply capacitor and a control chip. The control chip includes a logic controller, a unidirectional conduction tube, a switch tube, a power supply pin, an atomization pin, and a ground pin In which, the logic controller is connected to a first end of the airflow sensor and a first end of the switch tube; the logic controller, through the power supply pin, is connected to a first end of the power supply capacitor and a negative electrode of the unidirectional conduction tube; a positive electrode of the unidirectional conduction tube, through the atomization pin, is connected to a second end of the switch tube; and the logic controller, through the ground pin, is connected to a third end of the switch tube, a second end of the airflow sensor and a second end of the power supply capacitor;

In which, the atomization pin and the ground pin of the control chip are configured to connect with a power supply module and an atomization module to achieve an electronic atomization function. That is, the power supply module and the atomization module are controlled by the control chip to form a current path to achieve the electronic atomization function.

In accordance with a fourth aspect of the present application, it is provided an electronic atomization device, including a power supply module, an atomization module, and the control circuit as described in the third aspect;

In which, a positive electrode of the power supply module, through the atomization module, is connected to the atomization pin of the control chip, a negative electrode of the power supply module is connected to the ground pin of the control chip, and the negative electrode of the power supply module is grounded;

Alternatively, the positive electrode of the power supply module is connected to the atomization pin of the control chip, the negative electrode of the power supply module, through the atomization module, is connected to the ground pin of the control chip, and the negative electrode of the power supply module is grounded.

In accordance with a fifth aspect of the present application, it is provided a method for controlling an electronic atomization device, the electronic atomization device includes a logic controller, a switch tube, an airflow sensor, a battery, a capacitor and an atomizer, and the method includes:

Controlling ON/OFF state of the switch tube by the logic controller according to an airflow intensity signal. The ON/OFF state includes an OFF state and an ON state. The airflow intensity signal is generated according to the airflow intensity sensed by the airflow sensor;

When the switch tube is in the OFF state, the battery charges the capacitor and supplies power to the logic controller;

When the switch tube is in the ON state, the capacitor discharges to the logic controller, and the atomizer atomizes the tobacco tar.

In accordance with a sixth aspect of the present application, it is provided an electronic device. The electronic device includes a processor, a memory, and a computer program stored on the memory and capable of running on the processor. The steps of the method for controlling the electronic atomization device as described in the third aspect are implemented when the computer program is executed by the processor.

In accordance with a seventh aspect of the present application, it is provided a computer-readable storage medium on which a computer program is stored. The steps of the method for controlling the electronic atomization device as described in the third aspect are implemented when the computer program is executed by the processor.

In accordance with a eighth aspect of the present application, it is provided a computer program product. The method for controlling an electronic atomization device as described in the third aspect are implemented by a terminal device when the computer program product runs on the terminal device.

Beneficial Effects

The electronic atomization device and its control circuit provided by the embodiments of the present application have the following beneficial effects: by optimizing the control circuit, welding leads at the power supply pin VDD and the atomization pin AT of the control chip for connecting with the power supply module and the atomization module, the electronic atomization function can be achieved. Compared with the use of three welding leads in the related art, the embodiment of the present application can ensure a normal operation and control of the electronic atomization device, and the ground pin GND of the control chip does not need to be welded with a lead, so the number of welding leads that need to be drawn is reduced from three to two, the embodiment of the present application can not only optimize the layout design of the PCB, but also reduce the production cost caused by wire bonding, and meanwhile the risk of failure caused by manual operation can be effectively avoided.

In addition, the beneficial effect of another electronic atomization device and its control circuit provided by the embodiments of the present application is that: by optimizing the control circuit, welding leads at the ground pin (GND) and the atomization pin AT of the control chip for connecting the power supply module and the atomization module, the electronic atomization function can be achieved. Compared with the use of three welding leads in the related art, the embodiment of the present application can ensure a normal operation and control of the electronic atomization device without welding a lead at the power supply pin VDD of the control chip, so the number of welding leads that need to be drawn is reduced from three to two, the embodiment of the present application can not only optimize the layout design of the PCB, but also reduce the production cost caused by wire bonding, and meanwhile the risk of failure caused by manual operation can be effectively avoided.

BRIEF DESCRIPTION OF THE DRAWINGS

In order to illustrate the technical solutions of embodiments of the present application more clearly, a brief introduction regarding the accompanying drawings that need to be used for describing the embodiments is given below; Obviously, the drawings in the following description are merely some embodiments of the present application, and for ordinarily skilled one in the art, other drawings can also be obtained according to current drawings on the premise of paying no creative labor.

DETAILED DESCRIPTION OF THE EMBODIMENTS

In the following description, for the purpose of illustration rather than limitation, specific details such as a specific structure of a system and technology are proposed for a thorough understanding of the embodiments of the present application. However, it should be understood to those skilled in the art that other embodiments can also be implemented in the present application without these specific details. In other cases, detailed descriptions of well-known systems, devices, circuits, and methods are omitted to avoid unnecessary details from obstructing the description of the present application.

In view of the technical problems of high production cost and low reliability due to the large number of welding leads that need to be drawn in the production process of the current electronic atomization device, embodiments of the present application provide a control circuit, an electronic atomization device including the control circuit, and a method for controlling the electronic atomization device, by optimizing the control circuit, the number of welding leads in the control circuit of the electronic atomization device is reduced from three to two without affecting the operation effect of the electronic atomization device. The production cost is greatly reduced, and the reliability of the electronic atomization device is guaranteed.

The control circuit, the electronic atomization device, and the method for controlling the electronic atomization device provided in the present application will be described in detail below with reference to the accompanying drawings. It should be noted that since the following control circuit, electronic atomization device, and method for controlling the electronic atomization device are based on a same concept, the same or similar concepts or processes may not be repeated in some embodiments.

First Embodiment: Control Circuit

Figure 2:
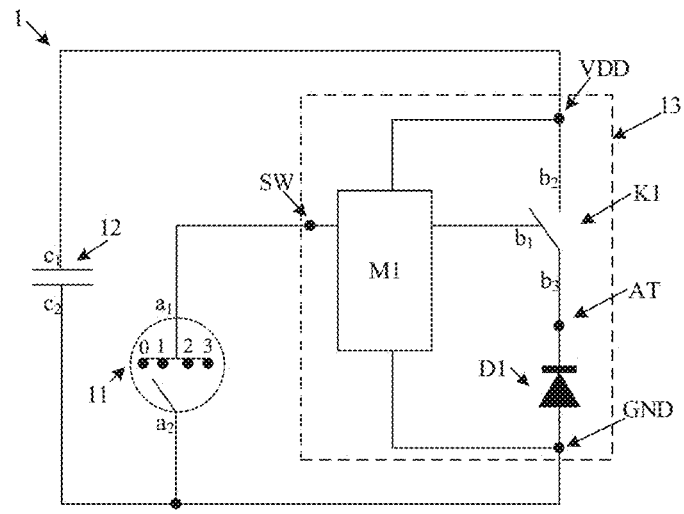
FIGS. 2 to 5 are schematic diagrams of a control circuit provided by an embodiment of the present application.

FIG. 2 shows a circuit diagram of a control circuit provided by an embodiment of the present application. As shown in FIG. 2, the control circuit 1 includes an airflow sensor 11, a power supply capacitor 12 and a control chip 13.

In the embodiment of the present application, the control chip 13 includes a logic controller M1, a unidirectional conduction tube D1, and a switch tube K1. The control chip 13 also includes a power supply pin VDD (i.e., the power supply pin of the chip), an atomization pin AT (i.e., the output pin of the chip), and a ground pin GND (i.e., the ground pin of the chip).

As shown in FIG. 2, the logic controller M1 is connected to a first end a1 of the airflow sensor 11 through the pin SW of the control chip 13. The logic controller M1 is connected to a first end b1 of the switch tube K1. The logic controller M1 is connected to a first end c1 of the power supply capacitor 12 (for example, the upper plate of the capacitor) and a second end b2 of the switch K1 through the power supply pin VDD. The logic controller M1 is connected to a positive electrode of the unidirectional conduction tube D1, a second end a2 of the airflow sensor 11 and a second end c2 of the power supply capacitor 12 (for example, the lower plate of the capacitor) through the ground pin GND. A negative electrode of the unidirectional conduction tube D1, through the atomizing pin AT of the control chip 13, is connected to a third end b3 of the switch tube K1.

In which, the power supply pin VDD and the atomization pin AT of the control chip 13 are respectively configured to connect with peripheral modules (such as a power supply module and an atomization module) to realize the electronic atomization function (the following takes the electronic cigarette function as an example). That is, the control chip is configured to control the battery module and the atomization module to form a current path to realize the electronic atomization function. It should be noted that the specific connection relationship between the control chip 13 and the peripheral modules will be described in detail in the embodiments of the electronic atomization device below, and thus are not repeated here.

Figure 1:
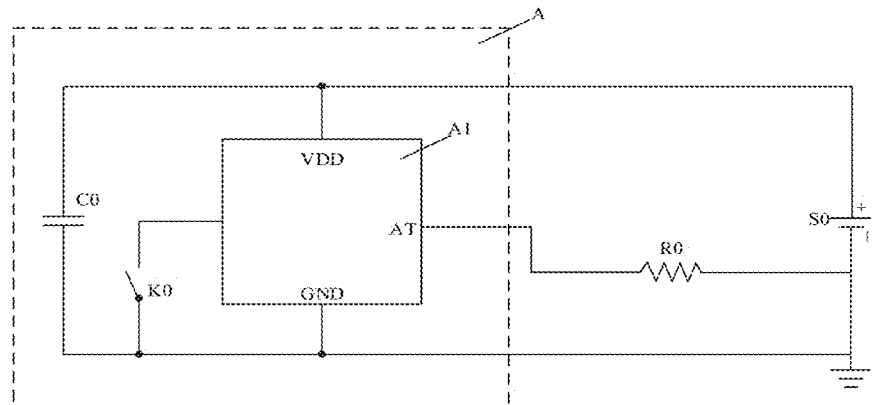
FIG. 1 is a schematic circuit diagram of an electronic atomization device in accordance with the related arts.

In the design of the traditional electronic atomization device shown in FIG. 1, a welding lead is needed at the ground pin GND for connecting to a negative electrode of the battery S0. In the control circuit provided by the embodiment of the present application, the ground pin GND does not need to be welded with a lead, thereby realizing the design of reducing the number of welding leads from three to two.

Referring to FIG. 2, the working principle of the control circuit provided by an embodiment of the present application will be explained by analyzing the flow direction of the signal flow between various modules in the control circuit.

As shown in FIG. 2, the power supply capacitor 12 and the logic controller M1 can form a current path. When a current path is formed, the power supply capacitor 12 can supply power to the logic controller M1 by way of discharging.

It should be noted that the power supply capacitor 12 needs to be pre-charged (for example, charged by a peripheral power supply module), so that when a current path is formed between the power supply capacitor 12 and the logic controller M1, power is supplied to the logic controller M1, that is, when a user smokes, the power supply capacitor 12 can supply power to the logic controller M1. The charging process and discharging process of the power supply capacitor 12 will be described in detail below, and thus are not repeated here.

As shown in FIG. 2, the power supply capacitor 12, the switch tube K1 and the unidirectional conduction tube D1 can also form a current path. When a current path is formed (that is, the switch tube K1 is in an ON state), the power supply capacitor 12 and the unidirectional conduction tube D1 can form a bootstrap circuit.

Optionally, in the embodiment of the present application, the power supply capacitor 12 may include one or more capacitors, or may include any other devices with charging and discharging functions, which may be specifically determined according to actual usage requirements, and are not limited in the embodiment of the present application.

Optionally, in the embodiment of the present application, the unidirectional conduction tube D1 may include a diode, or may be any other devices with a unidirectional conduction function, which may be specifically determined according to actual usage requirements, and are not limited in the embodiment of the present application.

In the embodiment of the present application, the unidirectional conduction tube D1 has the following technical effect: the circuit is in an ON state when a user is not smoking, in this case the power supply capacitor 12 is charged by the battery module, and the discharge of the power supply capacitor 12 is limited when the user is taking a puff, in this case, the power supply capacitor 12 completely supplies power to the control chip 13.

It should be noted that, compared with the voltage stabilizing effect of the capacitor C0 in the control circuit of the related art shown in FIG. 1, in the embodiment of the present application, the unidirectional conduction tube D1 is set in the control circuit to realize the purpose of supplying power to the control chip 13 by the power supply capacitor 12 when the user is smoking. 12, thus ensuring that the embodiment of the present application can still achieve the electronic atomization function normally when the three welding leads are changed to two welding leads.

Referring again to FIG. 2, a airflow intensity can be sensed by the airflow sensor 11 through the second end a2, then the airflow sensor 11 can convert the airflow intensity into an airflow intensity signal, and then output the airflow intensity signal to the logic controller M1 through the first end al.

It can be understood that when a user is taking a puff through the second end a2 of the airflow sensor 11, the airflow sensor 11 can sense the intensity of the airflow through the second end a2.

In the embodiment of the present application, during a user's smoking process, the airflow sensor 11 can be used to detect the presence and intensity of the airflow, and convert it into a level signal and output it to the control chip 13. Where the airflow sensor 11 may also be referred to as a microphone switch, a pneumatic switch or a microphone sensor.

Referring again to FIG. 2, the logic controller M1 is configured to receive the airflow intensity signal output by the first end al of the airflow sensor 11, control ON/OFF state of the switch tube K1 according to the airflow intensity signal, and control the switch frequency and/or the on-duty cycle of the switch tube K1 according to the airflow intensity signal to adjust the power of the atomization module.

In which, the ON/OFF state of the switch K1 includes an ON state and an OFF state. The switch frequency of the switch tube K1 may refer to the number of times the switch tube K1 is switched on within a certain period of time. The on-duty ratio of the switch K1 may refer to the ratio of the on-time to the total time in a pulse cycle.

Exemplarily, when the signal intensity of the airflow intensity signal is less than a preset value (corresponding to a situation where no user smokes), the logic controller M1 controls the switch tube K1 to be in an OFF state. And, when the signal intensity of the airflow intensity signal is greater than or equal to the preset value (corresponding to the situation where a user smokes), the logic controller M1 controls the switch tube K1 to be in an ON state.

The above-mentioned preset value can be set according to actual conditions, which is not limited in the embodiment of the present application.

Optionally, in the embodiment of the present application, the above-mentioned switch tube K1 may be a P-type metal oxide semiconductor (MOS) tube, or any other transistors that meet actual requirements. For example, the switch tube K1 may be a junction field effect transistor, which can be specifically determined according to actual usage requirements, and are not limited in the embodiment of the present application.

It can be understood that, in the control circuit provided by the embodiment of the present application, the switch tube K1 can function as a switch. On the one hand, when the signal intensity of the airflow intensity signal is less than a preset value, that is, when the user does not smoke, the switch tube K1 is in the OFF state, which is equivalent to the switch being in an open state. On the other hand, when the signal intensity of the airflow intensity signal is greater than or equal to the preset value, that is, when the user smokes, the switch tube K1 is in the ON state, which is equivalent to the switch being in a closed state. In short, the logic controller M1 can control the switch tube K1 to be opened when the user is not smoking, and to be closed when the user is smoking.

Specifically, the logic controller M1 is used to receive the smoking signal transmitted by the airflow sensor 11, and process and modulate the smoking signal to drive the switch tube K1 to be turned on. In this case, the atomization wire in the atomization module is heated to atomize tobacco tar.

In the embodiment of the present application, the switch tube K1 may be a P-type MOS tube or an N-type MOS tube. The different type of switch tube K1 have different the connection relationship of the control circuit, which will be described separately below.

The First Case: The Switch Tube K1 is a P-Type MOS Tube

Figure 3:
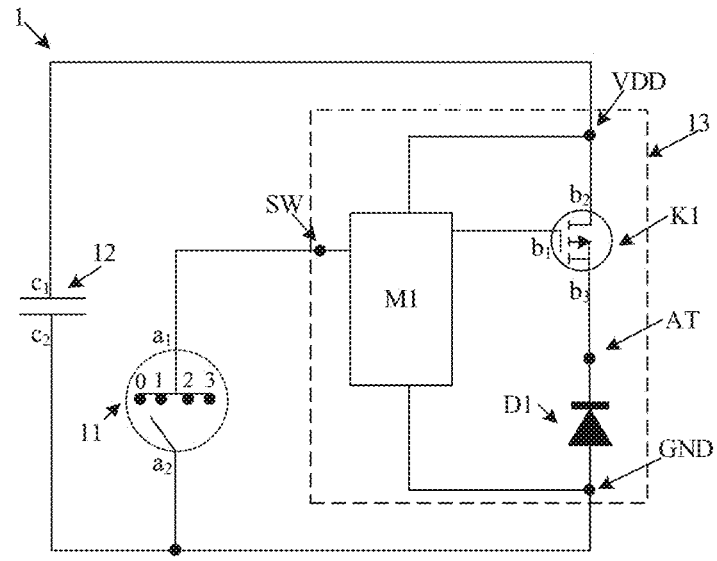

FIG. 3 shows a schematic diagram of the control circuit when the switch tube K1 is a P-type MOS tube. Referring to FIG. 3, the switch tube K1 is a P-type MOS tube, the first end b1 of the switch tube K1 is the gate, the second end b2 is the source, and the third end b3 is the drain.

Exemplarily, when the signal strength of the airflow intensity signal is greater than or equal to the preset value, that is, when the user smokes, the switch tube K1 is in the ON state (equivalent to the switch is closed), and the switch tube K1 can allow larger current flows from the second end b2 (source) to the third end b3 (drain).

The Second Case: The Switch Tube K1 is an N-Type MOS Tube

Figure 4:
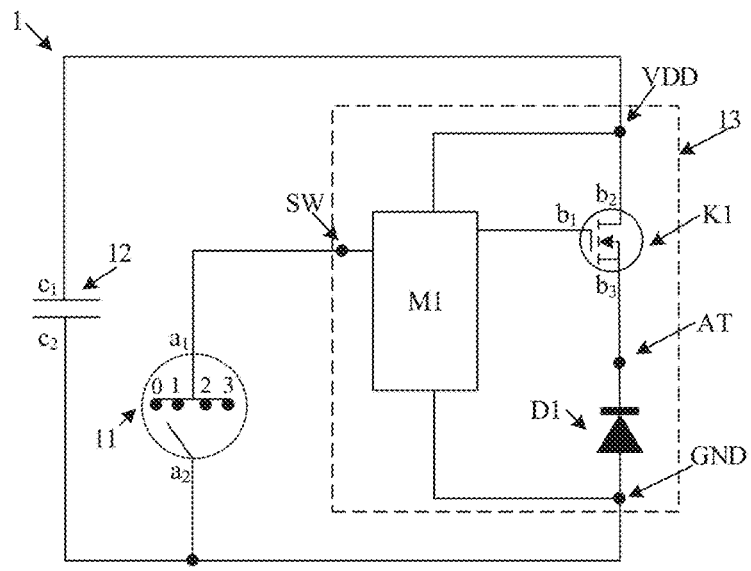

FIG. 4 shows a schematic diagram of the control circuit when the switch tube K1 is an N-type MOS tube. Referring to FIG. 4, the switch tube K1 is an N-type MOS tube, the first end b1 of the switch tube K1 is the gate, the second end b2 is the drain, and the third end b3 is the source.

Exemplarily, when the signal strength of the airflow intensity signal is greater than or equal to the preset value, that is, when the user smokes, the switch tube K1 is in the ON state (equivalent to the switch is closed), and the switch tube K1 can allow larger current flows from the second end b2 (drain) to the third end b3 (source).

Figure 5:
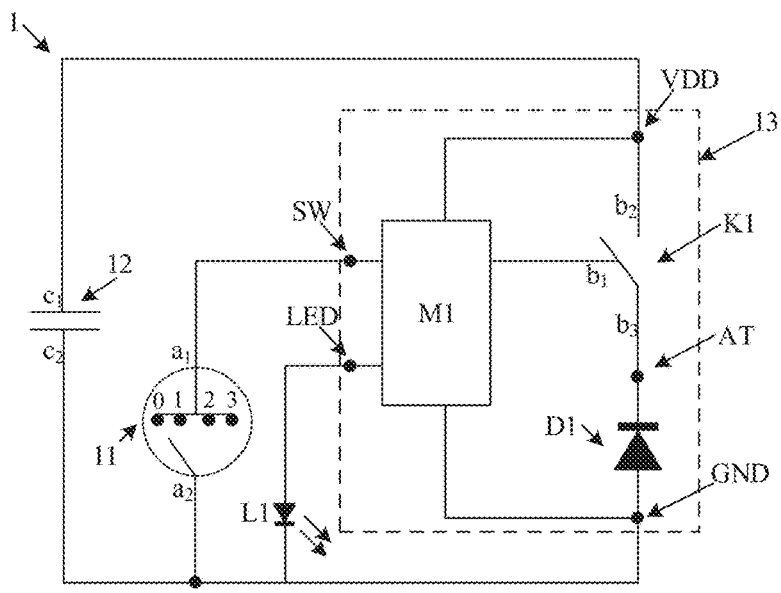

In an exemplary embodiment, in conjunction with FIG. 2, as shown in FIG. 5, the control circuit 1 may further include an indicator light L1, and the positive electrode of the indicator light L1 is connected to the logic controller M1 through a pin LED of the control chip 13; the negative electrode of the indicator light M1 is connected to the second end c2 of the power supply capacitor 12 and the second end a2 of the airflow sensor 11.

In which, the indicator light L1 can be driven by the control chip 13 to indicate the smoking situation or status of the user when using the electronic atomization device, and can also indicate the power status of the electronic atomization device, or can simultaneously indicate the use status (For example, smoking status) and power status of the electronic atomization device, which can be specifically determined according to actual usage requirements, and are not limited in the embodiment of the present application.

Optionally, in the embodiment of the present application, the indicator light L1 can be used to receive a driving signal output by the logic controller M1, and according to the voltage change of the driving signal, the brightness of the indicator light and/or the flashing light can be adjusted by pulse width modulation (PWM) mode.

In this way, the brightness of the indicator light can be changed according to a user smoke intensity, which truly simulates the lighting state of the cigarette when the user smokes.

In addition, the user can acknowledge whether the electric atomization device has sufficient power by observing the flashing mode of the indicator light. For example, if the indicator light shows green, it indicates that the electronic atomization device is currently full of electricity; if the indicator light shows red, it indicates that the electronic atomization device is currently low on electricity.

In the embodiment of the present application, the above-mentioned indicator light L1 may be a light emitting diode (LED), of course, it may also be any other light emitting devices that meet actual use requirements, which can be specifically determined according to actual use requirements, and are not limited in the embodiment of the present application.

The control circuit provided by the embodiments of the present application, by optimizing the control circuit, the lead of the control circuit that originally needs to be connected to the negative electrode of the battery does not need to be drawn on the premise that the operation effect of the electronic atomization device is ensured, so the number of welding wires is reduced from three to two (the lead at the ground pin GND is omitted), the production cost is greatly reduced, and meanwhile the reliability of the product is guaranteed.

Second Embodiment: Electronic Atomization Device

Figure 6:
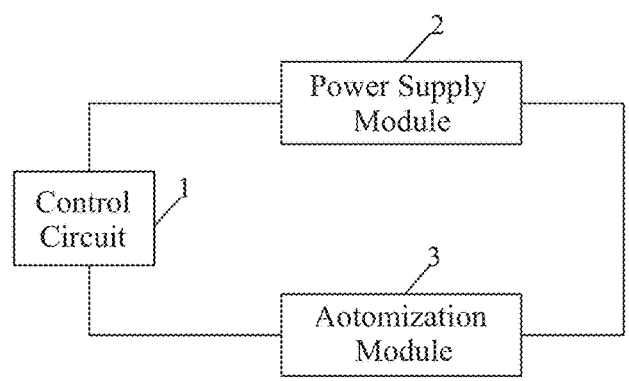
FIG. 6 is a schematic structural diagram of an electronic atomization device provided by an embodiment of the present application.

In combination with FIG. 2, as shown in FIG. 6, an embodiment of the present application further provides an electronic atomization device. The electronic atomization device includes the control circuit 1 as above described in the first embodiment, and the electronic atomization device further includes a power supply module 2 and an atomization module 3.

Optionally, in the embodiment of the present application, the electronic atomization device may be a heating atomization device, such as an electronic cigarette, or an inhalation-type energy bar, or may be any other possible electronic atomization device, which can be specifically determined according to actual usage requirements, and is not limited in the embodiment of the present application.

For ease of illustration and understanding, the electronic atomization device provided in the embodiment of the present application will be exemplarily described below by taking the electronic atomization device as an electronic cigarette as an example.

In the embodiment of the present application, the above-mentioned power supply module 2 may be a lithium battery, or may be any other battery that meets actual use requirements, which may be specifically determined according to actual use requirements, and is not limited in the embodiment of the present application. The above-mentioned atomization module 3 (also referred to as an atomizer) may include an atomization wire (also referred to as a load of heating wire) and tobacco tar; in actual implementation, the atomization wire generates heat when a current passes through the atomization wire, and then the tobacco tar is atomized.

As shown in FIG. 6, the power supply module 2 and the atomization module 3 are connected to each other, and both are connected to the control circuit 1. In actual implementation, in a scenario that the user is smoking, that is, when the switch tube K1 in the control circuit 1 is turned on, there is a current path formed between the control circuit 1 and the power supply module 2 and the atomization module 3 to achieve the electronic atomization function.

Figure 7:
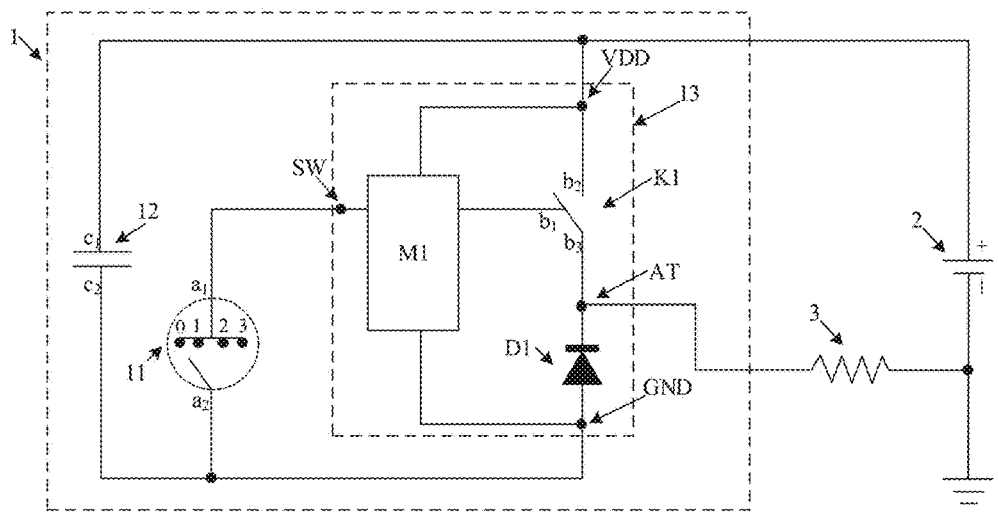
FIGS. 7 to 11 are schematic circuit connection diagrams of an electronic atomization device provided by an embodiment of the present application.

In a possible implementation, as shown in FIG. 7, a positive electrode of the power supply module 2 is connected to the power supply pin VDD of the control chip 13, and a negative electrode of the power supply module 2 is connected to the atomization pin AT of the control chip 13 through the atomization module 3, and the negative electrode of power supply module 2 is grounded.

Figure 8:
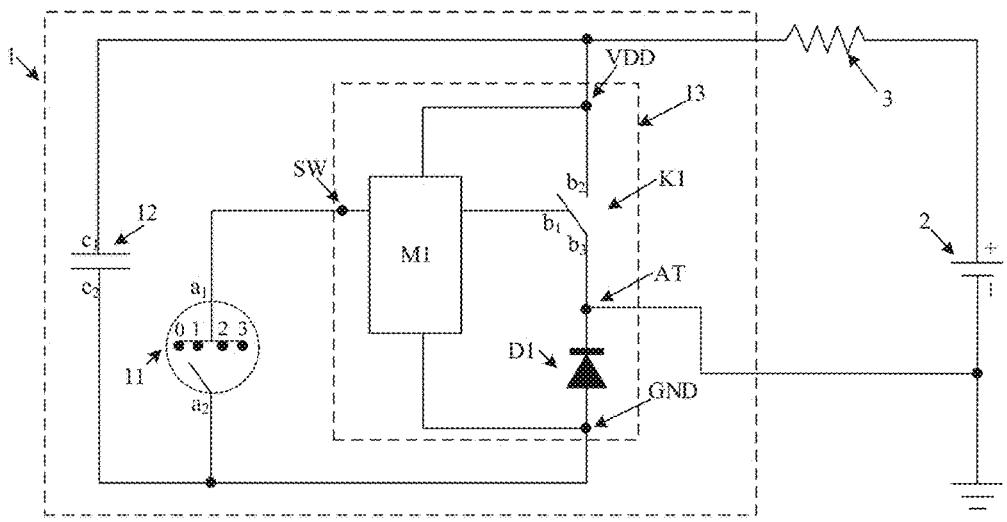

In another possible implementation, as shown in FIG. 8, the positive electrode of the power supply module 2 is connected to the power supply pin VDD of the control chip 13 through the atomization module 3, and the negative electrode of the power supply module 2 is connected to the atomization pin AT of the control chip 13, and the negative electrode of power supply module 2 is grounded.

In the embodiment of the present application, the power supply pin VDD and the atomization pin AT of the control chip are welded with leads for connecting the power supply module and the atomization module to met the use requirements of the electronic atomization device. Compared with the prior arts, the electronic atomization device provided by the embodiments of the present application does not require a welding lead between the ground pin GND of the control chip and the battery module.

It should be noted that the connection relationship between the above-mentioned control circuit 1 and the power supply module 2 and the atomization module 3 is an example enumerated. It can be understood that in actual implementation, the electronic atomization device provided by the embodiment of the present application may also include other possible implementations, for example, the connection relationship between the control circuit 1 and the power supply module 2 and the atomization module 3 in actual production can be determined according to the specific selection of the switch tube, which can also be determined according to actual usage requirements, and is not limited in the embodiment of the present application.

The electronic atomization device provided by the embodiment of the present application can achieve the electronic atomization function by providing two welding leads for connecting the control circuit of the electronic atomization device with the battery module and the atomization module, respectively. Compared with providing three welding leads in the related art, the number of welding leads in the electronic atomization device provided by the present application is reduced from three to two, which greatly reduces the production cost while ensuring the reliability of the electronic atomization device.

The following describes the circuit paths formed in the electronic atomization device for a user non-smoking scenario and a user smoking scenario respectively.

In the user non-smoking scenario: when the signal strength of the airflow intensity signal is less than the preset value, that is, when the user is not smoking (or stops smoking), the switch tube K1 is in the OFF state (equivalent to the switch is opened), the power supply module 2, the atomization module 3 and the switch tube K1 will not form a current path. When the user is not smoking, the power supply module 2, the atomization module 3, the power supply capacitor 12 and the unidirectional conduction tube D1 form a first current path, and the power supply capacitor 12 is charged by the power supply module 2. In addition, when the user is not smoking, the power supply module 2, the atomization module 3, the logic controller M1 and the unidirectional conduction tube D1 form a second current path, and the power supply module 2 supplies power to the logic controller M1.

In the user smoking scenario: when the signal strength of the airflow intensity signal is greater than or equal to the preset value, that is, when the user is smoking, the switch tube K1 is in the ON state (equivalent to the switch is closed), and the switch tube K1 can allow a larger current flows from the second end b2 to the third end b3. When the user is smoking, the power supply module 2, the atomization module 3 and the switch tube K1 form a third current path, and the atomization module 3 adjusts an amount of tobacco tar atomization according to the switch frequency and/or the on-duty ratio of the switch tube K1. In addition, when the user is smoking, the logic controller M1 and the power supply capacitor 12 form a fourth current path, and the power supply capacitor 12 supplies power to the logic controller M1.

Specifically, when the user smokes, the power supply capacitor 12 supplies power to the logic controller M1, the logic controller M1 receives the smoking signal transmitted by the airflow sensor 11, and drives the switch tube K1 after processing and modulation to turn on the switch tube K1. The voltage of the battery module 2 is applied to both ends of the atomization module 3. In this case, the atomization wire in the atomization module 3 is heated to atomize the tobacco tar.

In the embodiment of the present application, when different switch tubes are used in the control circuit 1, the connection relationship between the control circuit 1 and the power supply module 2 and the atomization module 3 may include multiple possible implementations. With reference to the drawings, the specific connection relationship and working principle of the electronic atomization device when the above-described control circuit 1 is connected with the battery module 2 and the atomization module 3 are described in the following first embodiment (where the switch tube K1 is a P-type MOS tube) and the second embodiment (where the switch tube K1 is an N-type MOS tube).

Implementation 1: The Switch Tube K1 is a P-Type MOS Tube

The switch tube K1 in the control circuit 1 is a P-type MOS tube; in which, the first end b1 of the switch tube (K1) is the gate (marked by G), the second end b2 is the source (marked by S), and the third end b3 is the drain (marked by D).

Figure 9:
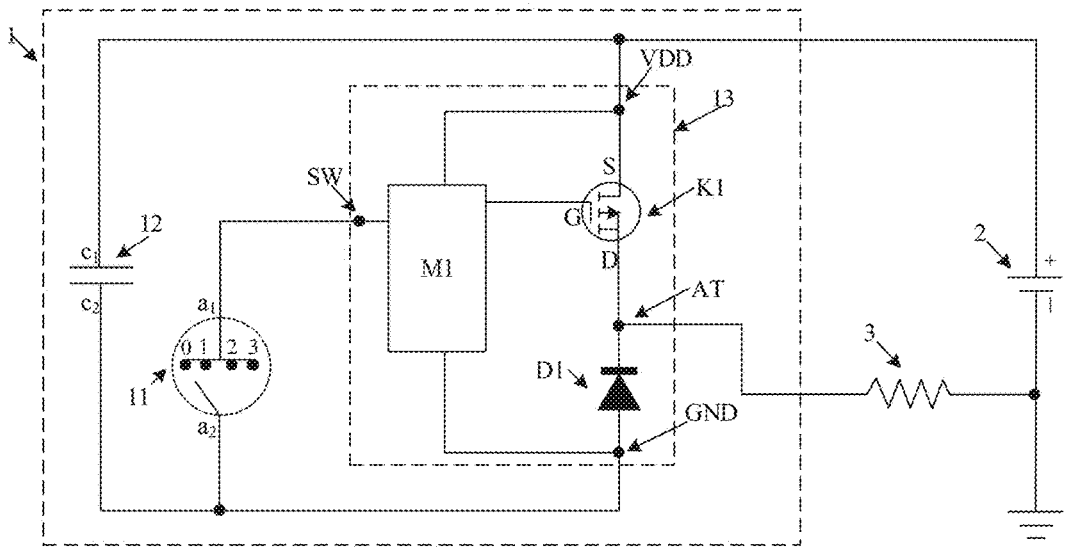

FIG. 9 shows a schematic circuit connection diagram of the electronic atomization device when the control circuit provided by the present application is a P-type MOS tube. As shown in FIG. 9, the gate G of the switch tube K1 is connected to the logic controller M1. The source S of the switch tube K1 is connected to the positive electrode of the power supply module 2 through the power supply pin VDD of the control chip 13. The drain D of the switch tube K1, through the atomization pin AT of the control chip 13 and the atomization module 3, is connected to the negative electrode of the power supply module 2. In addition, the negative electrode of the power supply module 2 is grounded.

In addition, for the case where the switch tube K1 is a P-type MOS tube, the electronic atomization device may also includes the following circuit connections (not shown in the figure): the gate of the switch tube K1 is connected to the logic controller M1; the source of the switch tube K1, through the power supply pin VDD of the control chip 13 and the atomization module 3, is connected to the positive electrode of the power supply module 2; the drain of the switch tube K1 is connected to the negative electrode of the power supply module 2 through the atomization pin AT of the control chip 13; and the negative electrode of the power supply module 2 is grounded.

With reference to FIG. 9, taking the switch tube K1 as a P-type MOS tube as an example, the working process of the electronic atomization device when the battery module 2 and the atomization module 3 are connected to the above-mentioned control circuit 1 is generally described as follows.

(1) When the user is not smoking, the positive electrode of the battery module 2 is connected to the upper plate of the power supply capacitor 12, and the lower plate of the power supply capacitor 12, through the unidirectional conduction tube D1 and the atomization module 3 is connected to the negative electrode of the battery module 2, such that the power supply capacitor 12 is charged by the battery module 2. Where a voltage difference between the upper and lower plates of the power supply capacitor 12 is approximately equal to the voltage value of the battery module 2. It should be noted that, in this case, the atomization wire in the atomizing module 3 serves as a conduction wire and will not atomize the tobacco tar. Meanwhile, the battery module 2 supplies power to the logic controller M1 in the control circuit 1, detects the signal condition on the airflow sensor 11 periodically, and waits for an instruction of the user smoke action.

(2) When the user is taking a puff, the airflow sensor 11 detects the airflow and converts it into a level signal and transmits it to the logic controller M1 in the control chip 13. The logic controller M1 controls the switch tube K1 to be closed. At this time, the battery module 2 and the atomization module 3 form a current loop, and the atomization module 3 starts to generate heat and atomize the tobacco tar to form an atomization effect. In this process, the logic controller M1 can control the ON/OFF time of the atomization wire in the atomizing module by PWM mode according to the user smoke intensity, so as to adjust the amount of tobacco tar atomization.

Although the battery module 2 cannot continue to supply power to the logic controller M1 in the control chip 13 at this time, due to the existence of the diode D1, after the switch K1 is closed, the potential difference between the upper and lower plates of the power supply capacitor 12 is still equal to the voltage of the battery, at this time, the power supply capacitor 12 takes over the battery module 2 to supply power to the logic controller M1 in the control core 13 to maintain the normal function of the logic controller M1 during the smoking experience.

(3) After the user finishes taking a puff, the switch tube K1 is opened. At this time, the battery module 2 supplies power to the logic controller M1 again, and meanwhile recharges the power supply capacitor 12. This charging process may be very fast, even if the user takes two smoking actions in a short interval, it can also ensure that the charging of the power supply capacitor 12 is completed.

Therefore, the embodiment of the present application can achieve a normal power supply and operation of the electronic atomization device after the number of welding leads for the control circuit (i.e., the control chip) is reduced from three to two.

Implementation 2: The Switch Tube K1 is N-Type MOS Tube

The switch tube K1 in the control circuit 1 is an N-type MOS tube. In which the first end b1 of the switch tube (K1) is the gate G, the second end b2 is the drain D, and the third end b3 is the source S.

Figure 10:
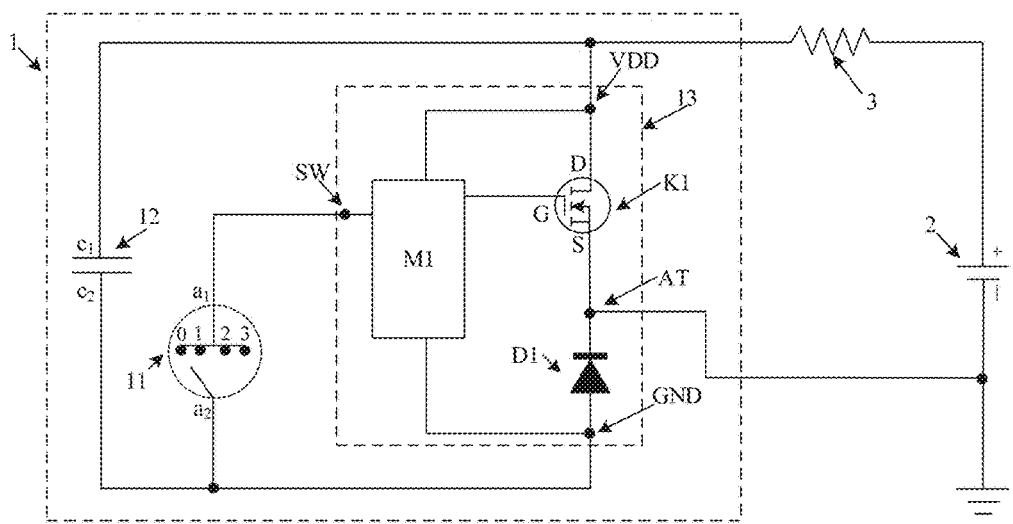

FIG. 10 shows a schematic circuit connection diagram of the electronic atomization device when the control circuit provided by the present application is an N-type MOS tube. As shown in FIG. 10, the gate G of the switch K1 is connected to the logic controller M1. The drain D of the switch tube K1, through the power supply pin VDD of the control chip 13 and the atomization module 3, is connected to the positive electrode of the power supply module 2. The source S of the switch tube K1 is connected to the negative electrode of the power supply module 2 through the atomization pin AT of the control chip 13. In addition, the negative electrode of the power supply module 2 is grounded.

In addition, for the case where the switch tube K1 is an N-type MOS tube, the electronic atomization device also includes the following circuit connection relationship: the gate G of the switch tube K1 is connected to the logic controller M1; the drain D of the switch tube K1 is directly connected to the positive electrode of the power supply module 2 through the power supply pin VDD of the control chip 13; and the source S of the switch tube K1, through the atomization pin AT of the control chip 13 and the atomization module 3, is connected to the negative electrode of the power supply module 2; and the negative electrode of the power supply module 2 is grounded.

In the implementation 2, the working process of the electronic atomization device, when the user is not smoking, when the user is taking a puff, and after the user finishes taking a puff, can be referred to the detailed description in the above-mentioned implementation 1, and will not be repeated here.

In a possible implementation, the electronic atomization device provided by the embodiment of the present application may further includes a switch module, which is configured to control the electronic atomization device to be switched between an enabled state and a disabled state according to a user operation instruction to the switch module.

Figure 11:
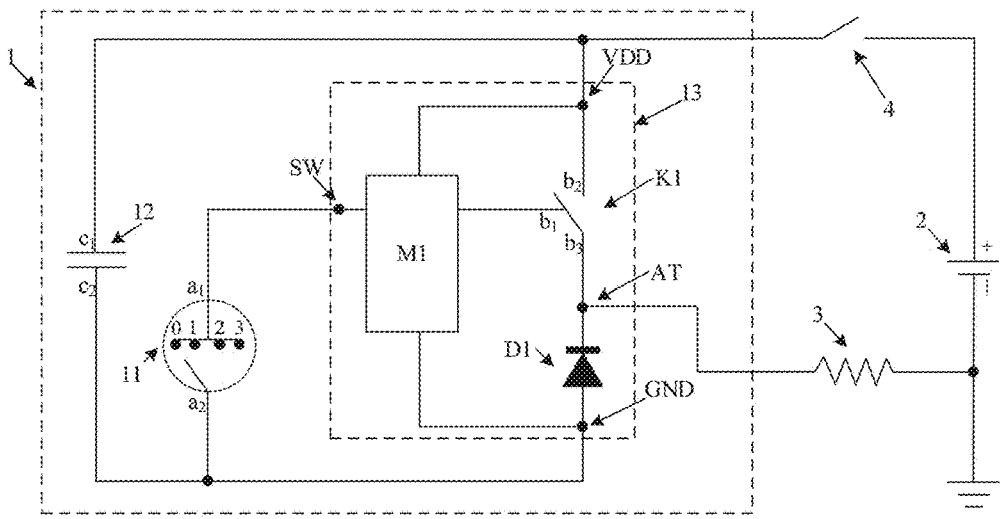

Exemplarily, in combination with FIG. 7, as shown in FIG. 11, the electronic atomization device further includes a switch module 4 which is arranged between the power supply pin VDD of the control chip 13 and the positive electrode of the power supply module 2.

Of course, the switch module may also be arranged in any other position in the electronic atomization device that meets actual use requirements, and it can be specifically determined according to actual use requirements, which is not limited in the embodiment of the present application.

Optionally, in the embodiment of the present application, the above-mentioned switch module may be a key switch, a touch switch, or a lip sensor switch, or any other switch that meets actual use requirements, which can be specifically determined according to actual use requirements, and is not limited in the embodiment of the present application.

Exemplarily, taking the switch module as a touch switch as an example, if the user wants to take a puff, the user may first touch the touch switch on the electronic atomization device to trigger the electronic atomization function to be turned on, and then the user can use the electronic atomization device to achieve a purpose of smoking. Further, if the user stops smoking, the user can touch the touch switch on the electronic atomization device again to trigger the electronic atomization function to be turned off. Or, in the case where it is detected that the action of user stops smoking lasts for a preset period of time, the electronic atomization device may be automatically turned off. In this way, the use safety of the electronic atomization device can be guaranteed.

In a possible implementation, the electronic atomization device provided in the embodiment of the present application further includes a casing and an electric control board. In which, the control circuit 1 is arranged on an electric control board, and the electric control board is accommodated in the casing.

In the embodiments of the present application, on the premise of ensuring the normal operation and control of the electronic atomization device, the control chip of the electronic atomization device does not need to be directly connected to the two electrodes of the battery at the same time, that is, the GND pin of the control chip does not need to be welded with a lead. The number of welding leads that need to be drawn is reduced from three to two, which can not only optimizes the layout design of the PCB, but also reduces the production cost due to the wire bonding, and the risk of failure caused by manual operation can be effectively avoided.

It should be noted that each of the drawings (such as FIG. 7, FIG. 8, etc.) in the above-mentioned embodiment of the present application is illustrated in combination with the above-mentioned FIG. 2. In specific implementations, it can also be implemented that each of the drawings in combination with any other figures that can be combined, for example FIG. 7 and FIG. 8 in combination with FIG. 5 can also be implemented.

The above illustrates an electronic atomization device and its control circuit, in which the control chip does not need to be directly connected to the two electrodes of the battery at the same time, that is, the ground pin GND of the control chip does not need to be welded with a lead, so the number of welding leads that need to be drawn is reduced from three to two. Another electronic atomization device and its control circuit are illustrated below, in which, the control circuit does not need to be directly connected to the two electrodes of the battery at the same time, that is, the power supply pin VDD of the control chip does not need to be welded with a lead. The number of welding leads is reduced from three to two. Both of these two electronic atomization devices and their control circuits have the following beneficial effects: they can not only optimize the layout design of the PCB, but also reduce the production cost due to wire bonding, and the risk of failure caused by manual operation can be effectively avoided.

Third Embodiment: Control Circuit

Figure 12:
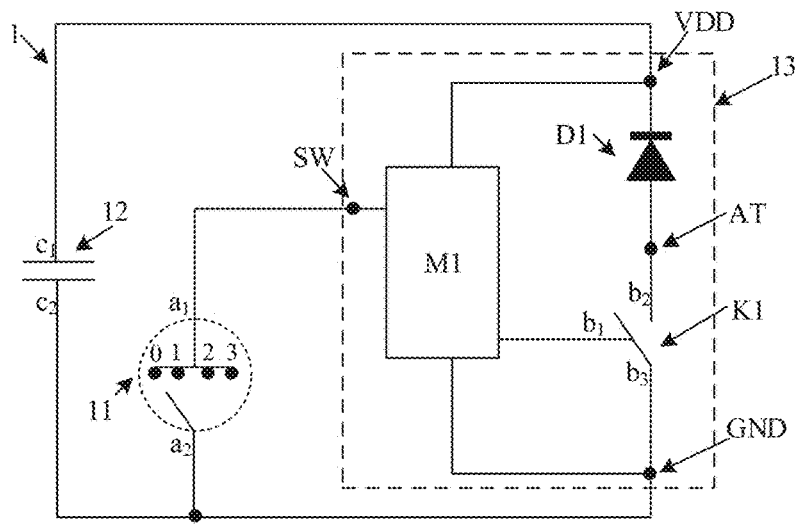
FIGS. 12 to 15 are schematic diagrams of another control circuit provided by an embodiment of the present application.

FIG. 12 shows a circuit diagram of a control circuit provided by an embodiment of the present application. As shown in FIG. 12, the control circuit 1 includes an airflow sensor 11, a power supply capacitor 12 and a control chip 13.

In the embodiment of the present application, the control chip 13 includes a logic controller M1, a unidirectional conduction tube D1, and a switch tube K1. The control chip 13 also includes a power supply pin VDD (that is, the power supply pin of the chip), an atomization pin AT (that is, the output pin of the chip), and a ground pin GND (that is, the ground pin of the chip).

As shown in FIG. 12, the logic controller M1 is connected to a first end a1 of the airflow sensor 11 through a pin SW of the control chip 13. The logic controller M1 is connected to a first end b1 of the switch tube K1. The logic controller M1 is connected to a first end c1 of the power supply capacitor 12 (for example, an upper plate of the capacitor) and a negative electrode of the unidirectional conduction tube D1 through the power supply pin VDD. A positive electrode of the unidirectional conduction tube D1 is connected to a second end b2 of the switch tube K1 through the atomizing pin AT. The logic controller M1 is connected to a third end b3 of the switch tube K1, a second end a2 of the airflow sensor 11 and a second end c2 of the power supply capacitor 12 (for example, the lower plate of the capacitor) through the ground pin GND.

In which, the atomization pin AT and the ground pin GND of the control chip 13 are respectively used to connect with peripheral modules (such as a power supply module and an atomization module) to realize the electronic atomization function (the following takes an electronic cigarette function as an example for illustration). That is, the control chip is used to control the battery module and the atomization module to form a current path to realize the electronic atomization function. It should be noted that the specific connection relationship between the control chip 13 and the peripheral modules will be described in detail in the embodiments of the electronic atomization device below, and thus will not be repeated here.

In the design of the traditional electronic atomization device as shown in FIG. 1, the power supply pin VDD needs to be welded with a connection lead for connecting with the positive electrode of the battery S0. In the control circuit provided by the embodiment of the present application, the power supply pin VDD does not need to be welded with a connection lead, thereby realizing the design of reducing the number of welding leads from three to two.

It should be noted that the working performances, functions and signal flow interaction principle of the various components in the control circuit in FIG. 12 (such as the airflow sensor 11, the power supply capacitor 12, the logic controller M1, the switch tube K, and the unidirectional conduction tube D1) is similar to those of varies components in the control circuit in FIG. 2, thus the description of various components will not be repeated here.

Optionally, in the embodiment of the present application, the above-mentioned switch tube K1 may be a MOS tube, or any other transistor that meets actual usage requirements. For example, the switch tube K1 may be a junction field effect transistor. It can be specifically determined according to actual usage requirements, which is not limited in the embodiment of the present application.

It can be understood that, in the control circuit provided by the embodiment of the present application, the switch tube K1 can function as a switch. On the one hand, when the signal intensity of the airflow intensity signal is less than a preset value, that is, when the user is not smoking, the switch tube K1 is in the OFF state, which is equivalent to the switch being opened. On the other hand, when the signal intensity of the airflow intensity signal is greater than or equal to the preset value, that is, when the user is smoking, the switch tube K1 is in the ON state, which is equivalent to the switch being closed. In short, the logic controller M1 can control the switch tube K1 to be opened when the user is not smoking, and closed when the user is smoking.

Specifically, the logic controller M1 is used to receive a smoking signal transmitted by the airflow sensor 11, and process and modulate the smoking signal to drive the switch tube K1 to be turned on. In this case, the atomization wire in the atomization module 3 is heated to atomize the tobacco tar.

In the embodiment of the present application, the switch tube K1 may be a P-type MOS tube or an N-type MOS tube. The switch tube K1 is different, and the connection relationship of the control circuit is different, which will be described separately below.

Figure 13:
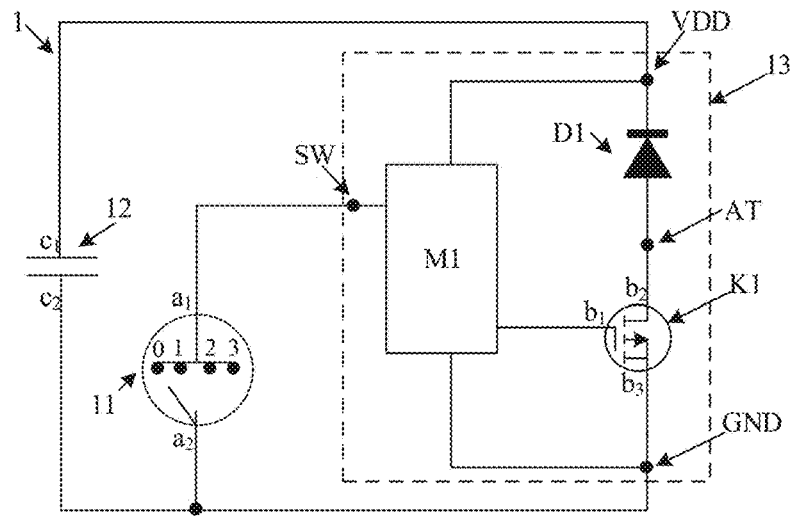

FIG. 13 shows a schematic diagram of the control circuit when the switch tube K1 is a P-type MOS tube. Referring to FIG. 13, the switch tube K1 is a P-type MOS tube, the first end b1 of the switch tube K1 is the gate, the second end b2 is the source, and the third end b3 is the drain. Exemplarily, when the signal strength of the airflow intensity signal is greater than or equal to the preset value, that is, when the user is taking a puff, the switch tube K1 is in the ON state (equivalent to the switch is closed), and the switch tube K1 can allow larger current flows from the second end b2 (source) to the third end b3 (drain).

Figure 14:
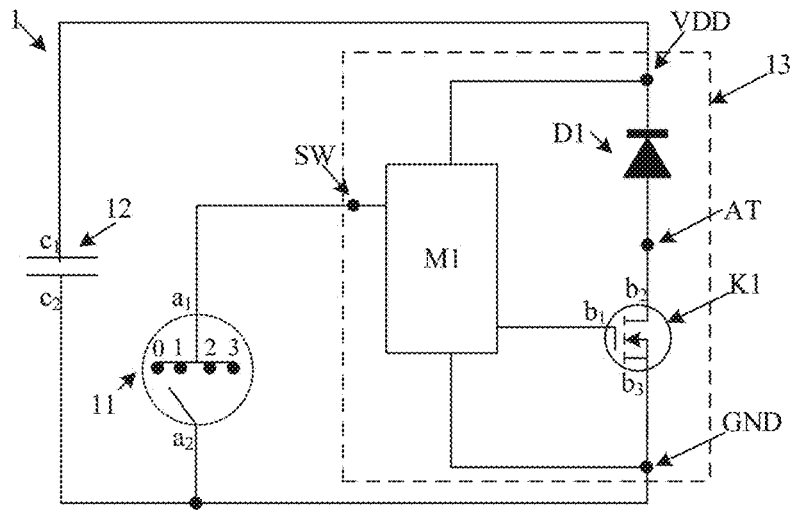

FIG. 14 shows a schematic diagram of the control circuit when the switch tube K1 is an N-type MOS tube. Referring to FIG. 14, the switch tube K1 is an N-type MOS tube, the first end b1 of the switch tube K1 is the gate, the second end b2 is the drain, and the third end b3 is the source. Exemplarily, when the signal strength of the airflow intensity signal is greater than or equal to the preset value, that is, when the user is taking a puff, the switch tube K1 is in the ON state (equivalent to the switch is closed), and the switch tube K1 can allow larger current flows from the second end b2 (drain) to the third end b3 (source).

Figure 15:
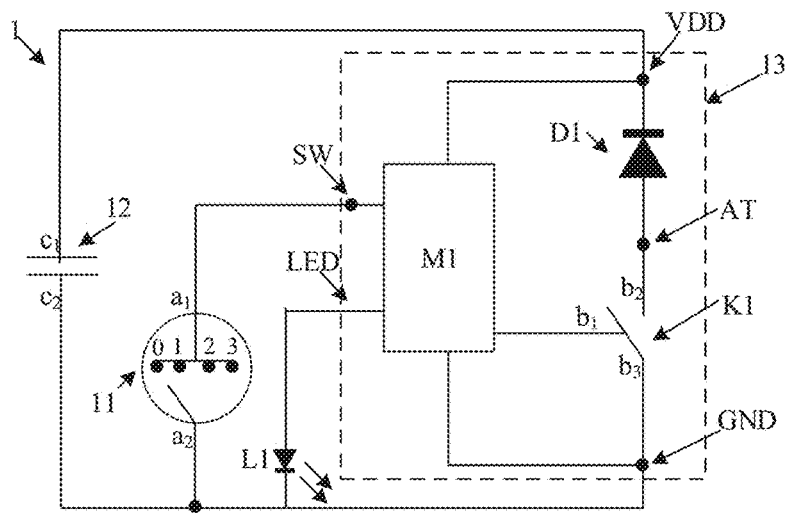

In a possible implementation manner, in combination with FIG. 12, as shown in FIG. 15, the control circuit 1 may further includes an indicator light L1, and the positive electrode of the indicator light L1 is connected to the logic controller M1 through a pin LED of the control chip 13, the negative electrode of the indicator light M1 is connected to the second end c2 of the power supply capacitor 12 and the second end a2 of the airflow sensor 11.

It should be noted that the operating characteristics and functions of the indicator light L1 in FIG. 15 are similar to those of the indicator light L1 in FIG. 5, so the description of the indicator light L1 can refer to the description of the indicator light L1 in FIG. 5, and thus will not be repeated here.

The control circuit provided by the embodiments of the present application, by optimizing the control circuit so that the lead of the control circuit that originally needs to be connected to the positive electrode of the battery does not need to be drawn on the premise of not affecting the use effect of the electronic atomization device, thus the number of welding wires is reduced from three to two (the lead at the power supply pin VDD is omitted), the production cost is greatly reduced, and the reliability of the product is guaranteed.

Fourth Embodiment: Control Circuit

Figure 16:
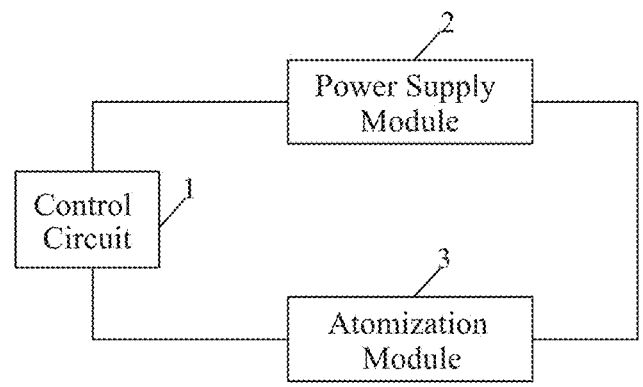
FIG. 16 is a schematic structural diagram of another electronic atomization device provided by an embodiment of the present application.

In combination with FIG. 12, as shown in FIG. 16, an embodiment of the present application further provides an electronic atomization device. The electronic atomization device includes the control circuit 1 described above in the third embodiment, and the electronic atomization device further includes a power supply module 2 and an atomization module 3.

Optionally, in the embodiments of the present application, the electronic atomization device may be a heating atomization device, such as an electronic cigarette, or an inhalation-type energy bar, or may be any other possible electronic atomization device, which can be specifically determined based on actual usage requirements, and is not limited in the embodiment of the present application.

For ease of illustration and understanding, the electronic atomization device provided in the embodiment of the present application will be exemplarily described below by taking the electronic atomization device as an electronic cigarette as an example.

In the embodiment of the present application, the above-mentioned power supply module 2 may be a lithium battery, or may be any other battery that meets actual use requirements, which may be specifically determined according to actual use requirements, and is not limited in the embodiment of the present application. The above-mentioned atomization module 3 (also called an atomizer) may include an atomization wire (also called a load of heating wire) and tobacco tar; in actual implementation, the atomization wire generates heat when a current passes through the atomization wire, and then the tobacco tar is atomized.

As shown in FIG. 16, the power supply module 2 and the atomization module 3 are connected to each other, and both are connected to the control circuit 1. In actual implementation, in a scenario that the user is smoking, that is, when the switch tube K1 in the control circuit 1 is turned on, there is a current path formed between the control circuit 1 and the power supply module 2 and the atomization module 3 to achieve the electronic atomization function.

Figure 17:
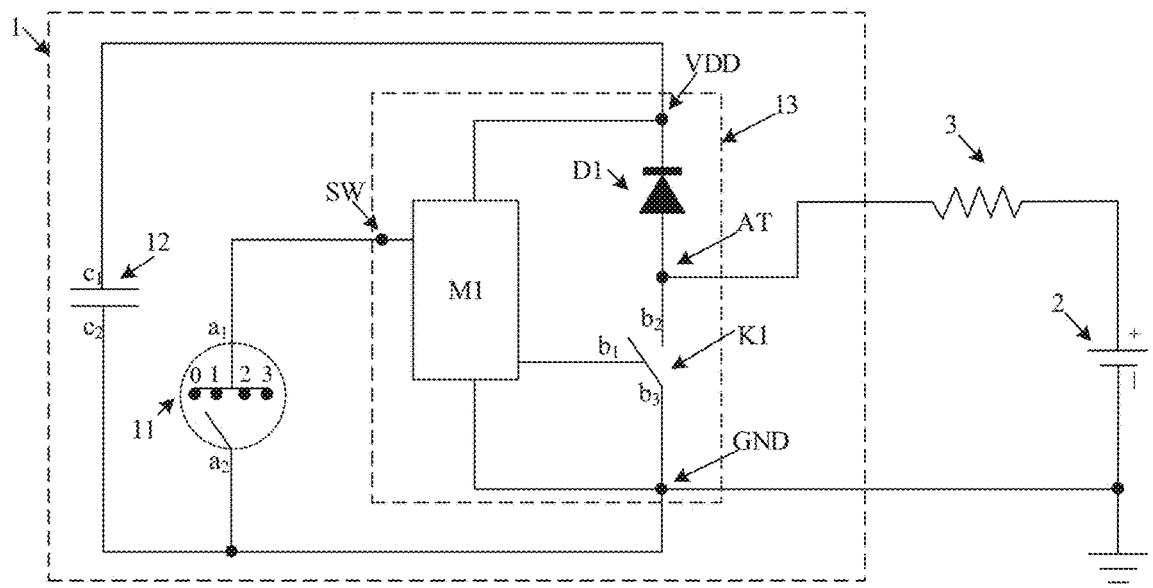
FIGS. 17 to 21 are schematic circuit connection diagrams of another electronic atomization device provided by an embodiment of the present application.

In a possible implementation, as shown in FIG. 17, the positive electrode of the power supply module 2 is connected to the atomization pin AT of the control chip 13 through the atomization module 3, and the negative electrode of the power supply module 2 is connected to the ground pin GND of the control chip 13, and the negative electrode of the power supply module 2 is grounded.

Figure 18:
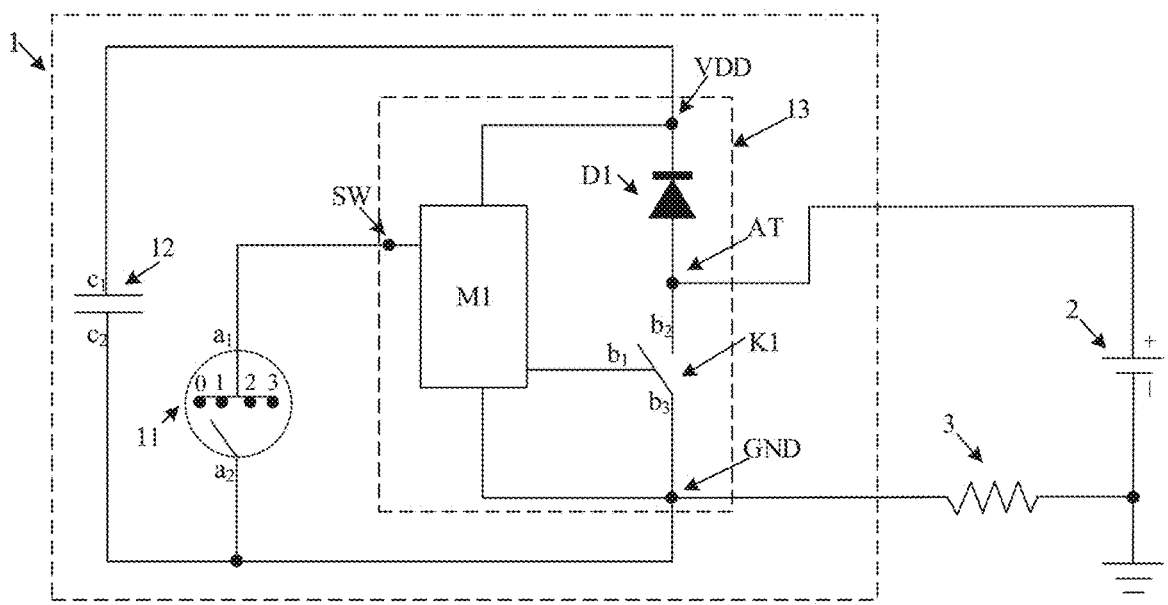

In another possible implementation, as shown in FIG. 18, the positive electrode of the power supply module 2 is connected to the atomization pin AT of the control chip 13, the negative electrode of the power supply module 2 is connected to the ground pin GND of the control chip 13 through the atomization module 3, and the negative electrode of power supply module 2 is grounded.

In the embodiment of the present application, the ground pin GND and the atomization pin AT of the control chip are welded with leads for connecting the power supply module and the atomization module to meet the use requirements of the electronic atomization device. Compared with the prior art, the electronic atomization device provided by the embodiments of the present application does not require a welding lead between the power supply pin VDD of the control chip and the battery module.

It should be noted that the connection relationship between the above-mentioned control circuit 1 and the power supply module 2 and the atomization module 3 is an exemplary enumerated. It can be understood that in actual implementation, the electronic atomization device provided by the embodiment of the present application may also include other possible implementations, for example, the connection relationship between the control circuit 1 and the power supply module 2 and the atomization module 3 in actual production can be determined according to the specific selection of the switch tube, which can be determined according to actual usage requirements, and is not limited in the embodiment of the present application.

The electronic atomization device provided by the embodiment of the present application can achieve the electronic atomization function by providing two welding leads for connecting the control circuit of the electronic atomization device with the peripheral battery module and atomization module, respectively. Compared with providing three welding leads in the related art, the number of welding leads in the electronic atomization device provided by the present application is reduced from three to two, which greatly reduces the production cost while ensuring the reliability of the electronic atomization device.

The following describes the circuit paths formed in the electronic atomization device for a user non-smoking scenario and a user smoking scenario, respectively.

In the user non-smoking scenario: when the signal strength of the airflow intensity signal is less than the preset value, that is, when the user is not smoking (or stops smoking), the switch tube K1 is in the OFF state (equivalent to the switch is opened), the power supply module 2, the atomization module 3 and the switch tube K1 will not form a current path. When the user is not smoking, the power supply module 2, the atomization module 3, the power supply capacitor 12 and the unidirectional conduction tube D1 form a first current path, and the power supply capacitor 12 is charged by the power supply module 2. In addition, when the user is not smoking, the power supply module 2, the atomization module 3, the logic controller M1 and the unidirectional conduction tube D1 form a second current path, and the power supply module 2 supplies power to the logic controller M1.

In the user smoking scenario: when the signal strength of the airflow intensity signal is greater than or equal to the preset value, that is, when the user is smoking, the switch tube K1 is in the ON state (equivalent to the switch closed), and the switch tube K1 can allow a larger current flows from the second end b2 to the third end b3. When the user is smoking, the power supply module 2, the atomization module 3 and the switch tube K1 form a third current path, and the atomization module 3 adjusts an amount of tobacco tar atomization according to the switch frequency and/or the on-duty ratio of the switch tube K1. In addition, when the user is smoking, the logic controller M1 and the power supply capacitor 12 form a fourth current path, and the power supply capacitor 12 supplies power to the logic controller M1.

Specifically, when the user smokes, the power supply capacitor 12 supplies power to the logic controller M1, the logic controller M1 receives the smoking signal transmitted by the airflow sensor 11, and drives the switch tube K1 after processing and modulation to turn on the switch tube K1. The voltage of the battery module 2 is applied to both ends of the atomization module 3. In this case, the atomization wire in the atomization module 3 is heated to atomize the tobacco tar.

In the embodiment of the present application, when different switch tubes are used in the control circuit 1, the connection relationship between the control circuit 1 and the power supply module 2 and the atomization module 3 may include multiple possible implementation. With reference to the drawings, the specific connection relationship and working principle of the electronic atomization device when the above-described control circuit 1 is connected with the battery module 2 and the atomization module 3 are described in the following first embodiment (where the switch tube K1 is a P-type MOS tube) and the second embodiment (where the switch tube K1 is an N-type MOS tube).

Implementation 1: The Switch Tube K1 is a P-Type MOS Tube

The switch tube K1 in the control circuit 1 is a P-type MOS tube; in which, the first end b1 of the switch tube (K1) is the gate (marked by G), the second end b2 is the source (marked by S), and the third end b3 is the drain (marked by D).

Figure 19:
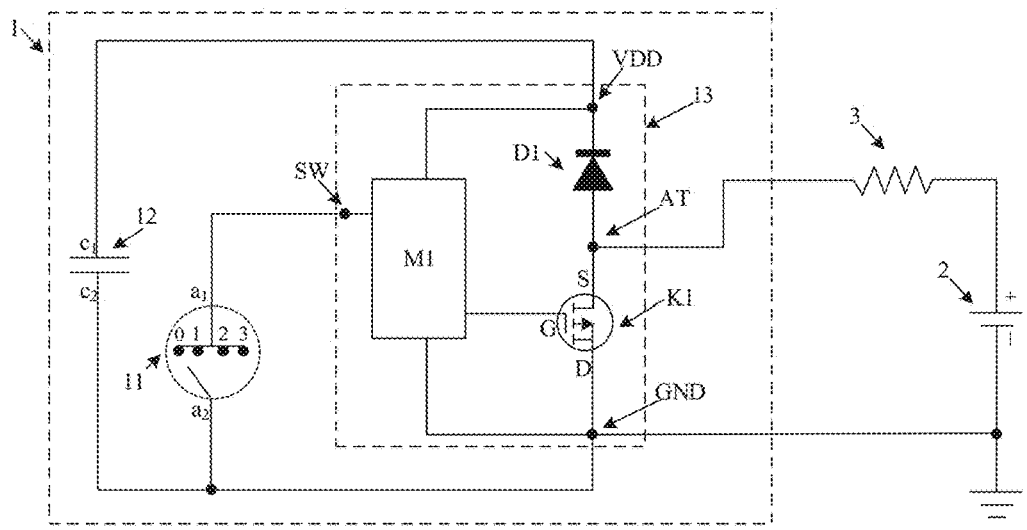

FIG. 19 shows a possible schematic circuit connection diagram of the electronic atomization device when the control circuit provided by the present application is a P-type MOS tube. As shown in FIG. 19, the gate G of the switch tube K1 is connected to the logic controller M1. The source S of the switch tube K1, through the atomization pin AT of the control chip 13 and the atomization module 3, is connected to the positive electrode of the power supply module 2. The drain D of the switch tube K1 is connected to the negative electrode of the power supply module 2 through the ground pin GND of the control chip 13. In addition, the negative electrode of the power supply module 2 is grounded.

In addition, for the case where the switch tube K1 is a P-type MOS tube, the electronic atomization device may also include the following circuit connection relationship (not shown in the figure): the gate G of the switch tube K1 is connected to the logic controller M1; The source S of the switch tube K1 is directly connected to the positive electrode of the power supply module 2 through the atomization pin AT of the control chip 13; the drain D of the switch tube K1, through the ground pin GND of the control chip 13 and the atomization module 3, is connected to the negative electrode of the power supply module 2; and the negative electrode of the power supply module 2 is grounded.

With reference to FIG. 19, taking the switch tube K1 as a P-type MOS tube as an example, the working process of the electronic atomization device when the battery module 2 and the atomization module 3 are connected to the above-mentioned control circuit 1 is generally described as follows.

(1) When the user is not smoking, the positive electrode of the battery module 2, through the atomization module 3 and the unidirectional conduction tube D1 in the control circuit 1, is connected to the upper plate of the power supply capacitor 12, the lower plate of the power supply capacitor 12 is connected to the negative electrode of the battery module 2, such that the power supply capacitor 12 is charged by the battery module 2. Where a voltage difference between the upper and lower plates of the power supply capacitor 12 is approximately equal to the voltage value of the battery module 2. It should be noted that, in this case, the atomization wire in the atomizing module 3 serves as a wire and will not atomize the tobacco tar.

Meanwhile, the battery module 2 supplies power to the logic controller M1 in the control circuit 1, detects the signal condition on the airflow sensor 11 periodically, and waits for an instruction of the user smoke action.

(2) When the user is taking a puff, the airflow sensor 11 detects the airflow and converts it into a level signal and transmits it to the logic controller M1 in the control chip 13. The logic controller M1 controls the switch tube K1 to be closed. At this time, the battery module 2 and the atomization module 3 form a current loop, and the atomization module 3 starts to generate heat and atomize the tobacco tar to form an atomization effect. In this process, the logic controller M1 can control the ON/OFF time of the atomization wire by PWM mode according to a user smoke intensity, so as to adjust the amount of tobacco tar atomization.

Although the battery module 2 cannot continue to supply power to the logic controller M1 in the control chip 13 at this time, due to the existence of the diode D1, after the switch K1 is closed, the potential difference between the upper and lower plates of the power supply capacitor 12 is still equal to the voltage of the battery, at this time, the power supply capacitor 12 takes over the battery module 2 to supply power to the logic controller M1 in the control core 13 to maintain the normal function of the logic controller 1141 during the smoking experience.

(3) After the user finishes taking a puff, the switch tube K1 is opened. At this time, the battery module 2 supplies power to the logic controller M1 again, and meanwhile recharges the power supply capacitor 12. This charging process is very fast, even if the user takes two smoking actions in a short interval, it can also ensure that the charging of the power supply capacitor 12 is completed.

Therefore, the embodiment of the present application can achieve the normal power supply and operation of the electronic atomization device after the number of welding leads of the control chip is reduced from three to two.

Implementation 2: The Switch Tube K1 is an N-Type MOS Tube

The switch tube K1 in the control circuit 1 is an N-type MOS tube. In which the first end b1 of the switch tube (K1) is the gate G, the second end b2 is the drain D, and the third end b3 is the source S.

Figure 20:
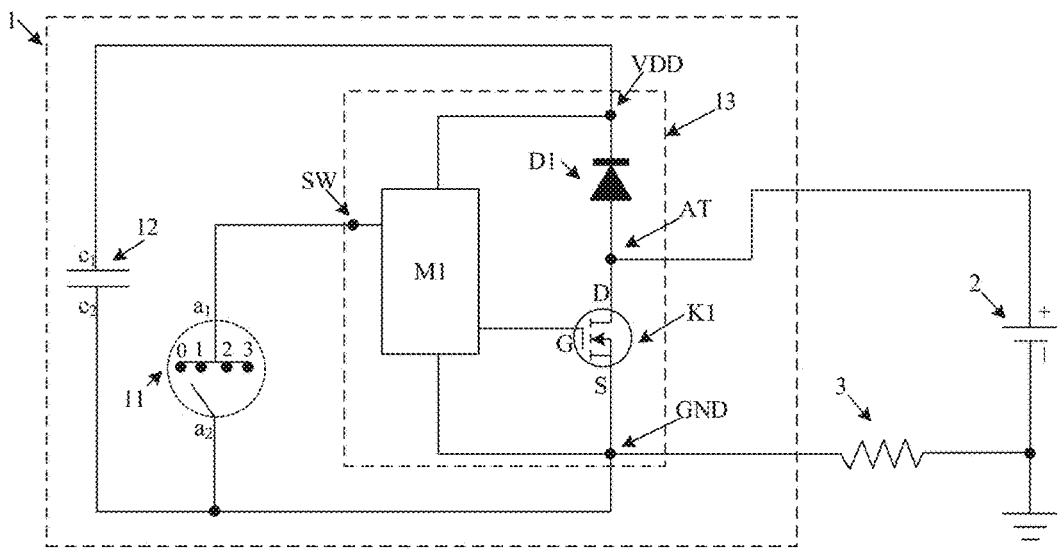

FIG. 20 shows a possible schematic circuit connection diagram of the electronic atomization device when the control circuit provided by the present application is an N-type MOS tube. As shown in FIG. 20, the gate G of the switch tube K1 is connected to the logic controller M1. The drain D of the switch tube K1 is directly connected to the positive electrode of the power supply module 2 through the atomization pin AT of the control chip 13. The source S of the switch tube K1, through the ground pin GND of the control chip 13 and the atomization module 3, is connected to the negative electrode of the power supply module 2. In addition, the negative electrode of the power supply module 2 is grounded.

In addition, for the case where the switch tube K1 is an N-type MOS tube, the electronic atomization device may also include the following circuit connection relationship (not shown in the figure): the gate G of the switch tube K1 is connected to the logic controller M1; the drain D of the switch tube K1, through the atomization pin AT of the control chip 13 and the atomization module 3, is connected to the positive electrode of the power supply module 2; the source S of the switch tube K1 is directly connected to the negative electrode of the power supply module 2 through the ground pin GND of the control chip 13; and the negative electrode of the power supply module 2 is grounded.

In the implementation 2, the working process of the electronic atomization device, when the user is not smoking, when the user is taking a puff, and after the user finishes taking a puff, can be referred to the detailed description in the above-mentioned implementation 1, and will not be repeated here.

In a possible implementation, the electronic atomization device provided by the embodiment of the present application may further includes a switch module, which is configured to control the electronic atomization device to be switched between an enabled state and a disabled state according to a user operation instruction to the switch module.

Figure 21:
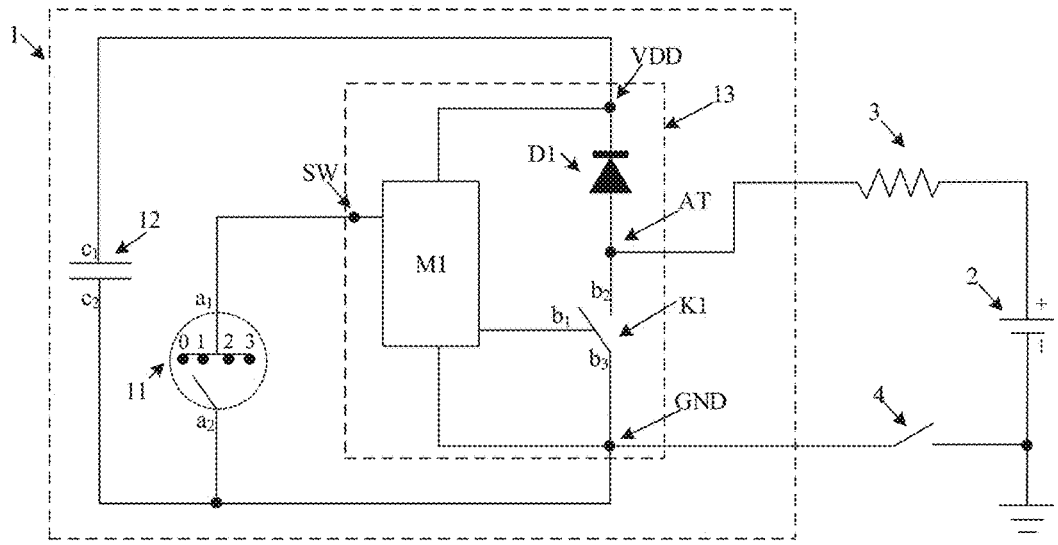

Exemplarily, in combination with FIG. 17, as shown in FIG. 21, the electronic atomization device further includes a switch module 4 which is arranged between the ground pin GND of the control chip 13 and the negative electrode of the power supply module 2.

Of course, the switch module can also be arranged in any other position in the electronic atomization device that meets actual use requirements, and it can be specifically determined according to actual use requirements, which is not limited in the embodiment of the present application.

Optionally, in the embodiment of the present application, the above-mentioned switch module may be a key switch, a touch switch, or a lip sensor switch, or any other switch that meets actual use requirements, which can be determined according to actual use requirements, and is not limited in the embodiment of the present application.

Exemplarily, taking the switch module as a touch switch as an example, if the user wants to take a puff, the user may first touch the touch switch on the electronic atomization device to trigger the electronic atomization function to be turned on, and then the user can use the electronic atomization device to achieve a purpose of smoking. Further, if the user stops smoking, the user can touch the touch switch on the electronic atomization device again to trigger the electronic atomization function to be turned off. Or, in the case where it is detected that the action of user stops smoking lasts for a preset period of time, the electronic atomization device may be automatically turned off. In this way, the use safety of the electronic atomization device can be guaranteed.

In a possible implementation, the electronic atomization device provided in the embodiment of the present application further includes a casing and an electric control board. In which, the control circuit 1 is arranged on an electric control board, and the electric control board is accommodated in the casing.

In the embodiments of the present application, on the premise of ensuring the normal operation and control of the electronic atomization device, the control circuit of the electronic atomization device does not need to be directly connected to the two electrodes of the battery at the same time, that is, there is no need for welding a lead at the power supply pin VDD of the control chip. As a result, the number of welding leads that need to be drawn is reduced from three to two, which can optimize the layout design of the PCB, reduce the production cost due to the wire bonding, and effectively avoid the risk of failure caused by manual operation.

It should be noted that each of the drawings (such as FIG. 17, FIG. 18, etc.) in the above-mentioned embodiments of the present application is illustrated in conjunction with the above-mentioned FIG. 12. In specific implementations, it can also be implemented that each of the drawings in combination with any other figures that can be combined, for example, FIG. 17 and FIG. 18 in combination with FIG. 15 can also be implemented.

It should also be noted that those skilled in the art can clearly understand that for the convenience and conciseness of description, only the division of the above functional units and modules is used as an example for illustration. In practical applications, the above functions can be allocated as needed. It is completed by different functional units and modules, that is, the internal structure of the device is divided into different functional units or modules to complete all or part of the functions described above. The functional units and modules in the embodiments can be integrated into one processing unit, or each unit can exist alone physically, or two or more units can be integrated into one unit. The above-mentioned integrated units can be hardware-based Form realization can also be realized in the form of software functional unit. In addition, the specific names of the functional units and modules are only for the convenience of distinguishing each other, and are not used to limit the protection scope of the present application.

Fifth Embodiment: Method for Controlling Electronic Atomization Device

An embodiment of the present application also provides a method for controlling an electronic atomization device which can be applied to the electronic atomization device as above-mentioned in the first embodiment or the second embodiment. The electronic atomization device includes a logic controller, a switch tube, an airflow sensor, a battery, a capacitor and an atomizer.

It should be noted that an execution subject of the method for controlling the electronic atomization device provided by the embodiment of the present application may be the above-mentioned electronic atomization device, or the electronic atomization device that can implement the method for controlling the electronic atomization device. The functional modules and/or functional entities (for example, logic controllers) can be specifically determined according to actual usage requirements, which are not limited in the embodiment of the present application. The following takes a logic controller as an example to illustrate the method for controlling the electronic atomization device provided in the embodiment of the present application.

Figure 22:
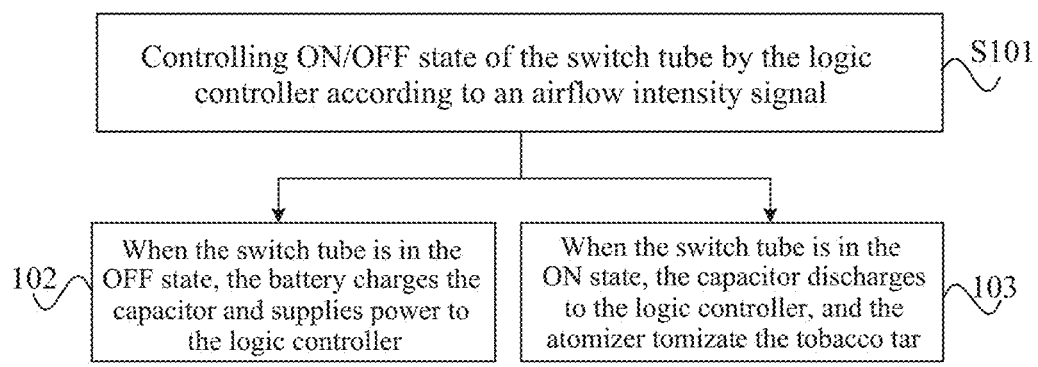
FIG. 22 is a schematic flowchart of a method for controlling an electronic atomization device according to an embodiment of the present application.

FIG. 22 shows a schematic flowchart of a method for controlling an electronic atomization device provided by an embodiment of the present application. As shown in FIG. 22, the method for controlling the electronic atomization device includes the following steps of S101-S103.

S101: Controlling ON/OFF state of the switch tube in the electronic atomization device by the logic controller according to an airflow intensity signal.

In which, the ON/OFF state includes an OFF state and an ON state. The airflow intensity signal is generated by the logic controller according to the airflow intensity sensed by the airflow sensor.

S102: When the switch tube is in the OFF state, the battery charges the capacitor and supplies power to the logic controller.

S103: When the switch tube is in the ON state, the capacitor discharges to the logic controller, and the atomizer performs an atomization of the tobacco tar.

In which, in the embodiment of the present application, the foregoing S102 and S103 may be alternatively executed.

Optionally, in the embodiment of the present application, the above-mentioned switch tube may be a P-type MOS tube, or may be an N-type MOS tube. Of course, the switch tube may also be any other transistor that meets actual use requirements, which may be specifically determined according to actual use requirements, and is not limited in the embodiment of the present application.

In the embodiment of the present application, when the switch tube is in the OFF state, that is, when the user is not smoking (or stops smoking), the battery in the electronic atomization device can not only charge the capacitor, but also supply power to the logic controller, So that the logic controller can periodically detect a user smoking instruction. In addition, when the switch tube is in the ON state, that is, when the user is taking a puff, the capacitor discharges to the logic controller, and meanwhile, the atomizer in the electronic atomization device atomizes the tobacco tar.

The method for controlling the electronic atomization device provided by the embodiment of the present application is applied to the above-mentioned improved electronic atomization device (that is, using two welding leads), which can achieve a charging of the power supply capacitor by the battery when the user is not smoking, and supply power to the electronic atomization device by the power supply capacitor when the user is smoking, and achieve an atomization function of tobacco tar. Compared with the solutions in the related arts that use three welding leads and use a battery to supply power to the logic controller, the embodiment of the present application can reduce production costs and improve product reliability.

Optionally, in the embodiment of the present application, the step of controlling the ON/OFF state of the switch tube in the electronic atomization device (the above step of S101) according to the airflow intensity signal may specifically include the following steps of S101A and S101B.

S101A: When the signal intensity of the airflow intensity signal is less than a preset value, the logic controller controls the switch tube to be in an OFF state.

If the signal intensity of the airflow intensity signal is less than the preset value, it indicates that the user is not smoking, and the switch tube is in the OFF state. Further, the capacitor is charged by the battery in the electronic atomization device.

S101B: When the signal intensity of the airflow intensity signal is greater than or equal to the preset value, the logic controller controls the switch tube to be in an ON state.

If the signal strength of the airflow intensity signal is greater than or equal to the preset value, it indicates that the user is taking a puff, and the control switch tube is in the ON state. Further, the capacitor in the electronic atomization device supplies power to the logic controller, and the atomizer in the electronic atomization device is heated to atomize the tobacco tar to achieve the electronic atomization function.

Optionally, in the embodiment of the present application, the method for controlling the electronic atomization device provided in the embodiment of the present application may further include the following step of S104.

S104: The logic controller controls the switch frequency and/or the on-duty ratio of the switch tube according to the airflow intensity signal to adjust the power of the atomizer.

In which, the switch frequency of the switch tube may refer to the number of times the switch tube is turned on within a certain period of time. The on-duty ratio of the switch tube may refer to the ratio of the on-time to the total time in a pulse cycle.

In the embodiment of the present application, the ON/OFF time of the atomization wire in the atomizer can be controlled by PWM mode according to the user smoke intensity, so as to adjust the power of the atomizer, thereby controlling the amount of the tobacco tar atomization of the electronic atomization device.

Optionally, in the embodiment of the present application, the method for controlling the electronic atomization device provided in the embodiment of the present application may further include the following step of S105.

S105. The logic controller adjust the brightness and/or flashing mode of the indicator light in the electronic atomization device by PWM mode according to voltage change of the airflow intensity signal.

For a specific description of how to adjust the brightness and/or flashing mode of the indicator light in the electronic atomization device, please refer to the detailed description of adjusting the brightness and/or flashing mode in the above-mentioned control circuit embodiment, which will not be repeated here.

Optionally, in the embodiment of the present application, before the step of sensing the airflow intensity by the electronic atomization device (S101), the method for controlling the electronic atomization device provided in the embodiment of the present application may further include the following step of S106.

S106: In response to the user operation instruction to activate a switch control in the electronic atomization device, an ON/OFF valve is closed, so that the electronic atomization device is in an ON state.

In the embodiment of the present application, the electronic atomization device senses the airflow only after the activation of the electronic atomization device is triggered by the user, thereby ensuring the safety of the electronic atomization device.

In which, the ON/OFF valve may be a key switch, or a touch switch, or any other switch that meets actual use requirements, which can be specifically determined according to actual use requirements, and is not limited in the embodiment of the present application.

For a specific description of how to activate the electronic atomization device, please refer to the detailed description of using the switch module to trigger the activation of the electronic atomization device in the above embodiment of the electronic atomization device, which will not be repeated here.

It should be understood that the size of the sequence number of each step in the foregoing embodiment does not mean an order of execution. The execution sequence of each process should be determined by its function and internal logic, and should not constitute any limitations on the implementation process of the embodiment of the present application.

It should be noted that the execution process and other contents of the foregoing method embodiments are based on the same concept as the device embodiments of the present application, and the specific functions and technical effects can be found in sections of device embodiments for details, and will not be repeated here.

Figure 23:
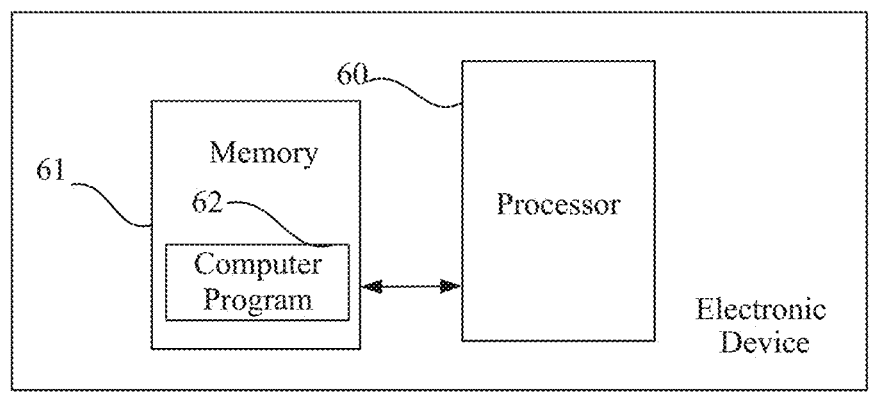
FIG. 23 is a schematic structural diagram of an electronic device provided by an embodiment of the present application.

As shown in FIG. 23, an embodiment of the present application also provides an electronic device. The electronic device includes: at least one processor 60, a memory 61, and a computer program 62 that is stored in the memory 61 and can run on the at least one processor 60. The processor 60 is configured to implement the steps in any of the foregoing method embodiments when the processor 60 executes the computer program 62.

The embodiments of the present application also provide a computer-readable storage medium which stores a computer program, and when the computer program is executed by a processor, the steps in the foregoing method embodiments can be implemented.

The embodiments of the present application provide a computer program product. The computer program product can run on an electronic device, the steps in the foregoing method embodiments can be implemented when executed by the electronic device.

If the aforementioned integrated unit is implemented in the form of a software functional unit and sold or used as an independent product, it can be stored in a computer readable storage medium. Based on this understanding, the implementation of all or part of the processes in the above-mentioned method embodiments in the present application can be completed by instructing relevant hardware through a computer program. The computer program can be stored in a computer-readable storage medium. When executed by a processor, the steps of the foregoing method embodiments can be implemented. In which the computer program includes computer program code, and the computer program may be in source code form, object code form, executable file form, or some intermediate forms. The computer-readable medium may at least include: any entity or device, recording medium, computer memory, read-only memory (ROM), random access memory (RAM), electrical carrier signals, telecommunications signals, and software distribution media that are capable of carrying computer program code to a camera/terminal device. Such as U disk, mobile hard disk, floppy disk or CD-ROM, etc. In some jurisdictions, according to legislation and patent practices, computer-readable media cannot be electrical carrier signals and telecommunication signals.

In the above-mentioned embodiments, the description of each embodiment has its own focus. For parts that are not described or recorded in detail in an embodiment, reference may be made to related descriptions of other embodiments.

It will be appreciated for persons skilled in the art that the units and algorithm steps of the examples described in combination with the embodiments disclosed herein can be implemented by electronic hardware, or a combination of computer software and electronic hardware. Whether these functions are executed by hardware or software depends on the specific application and design constraint conditions of the technical solution. Professionals and technicians can use different methods for each specific application to implement the described functions, but such implementation should not be considered beyond the scope of the present application.

In the embodiments provided in the present application, it should be understood that the disclosed device/electronic device and method may be implemented in other ways. For example, the device/electronic device embodiments described above are only illustrative. For example, the division of modules or units is only a logical function division. In actual implementation, there may be other ways of division, such as multiple units or components can be combined or integrated into another system, or some features can be ignored or not implemented. In addition, the displayed or discussed mutual coupling or direct coupling or communication connection may be indirect coupling or communication connection through some interfaces, devices or units, and may be in electrical, mechanical or other forms.

The units described above as separate components may or may not be physically separated, and the components displayed as units may or may not be physical units, that is, they may be located in one place, or they may be distributed on multiple network units. Some or all of the units may be selected according to actual needs to achieve the objects of the technical solutions of the embodiments.

It should be understood that when used in the specification and appended claims of the present application, the term "comprising/comprise" indicates the existence of the described features, wholes, steps, operations, elements and/or components, but does not exclude one or more other existence or addition of features, wholes, steps, operations, elements, components, and/or combinations thereof.

It should also be understood that the term "and/or" used in the specification and appended claims of the present application refers to any combination of one or more of the items listed in the associated and all possible combinations, and includes these combinations.

As used in the description of the present application and the appended claims, the term "if" can be interpreted as "when" or "once" or "in response to determination" or "in response to detecting . . . ". Similarly, the phrase "if determined" or "if detected (described condition or event)" can be interpreted as meaning "once determined" or "in response to determination" or "once detected [described condition or event]" or "in response to detection of [described condition or event]" depending on the context.

In addition, in the description of the specification of the present application and the appended claims, the terms "first", "second", "third", etc. are merely used to distinguish description, and cannot be understood as indicating or implying relative importance.

The reference to "an embodiment" or "some embodiments" described in the specification of the present application means that one or more embodiments of the present application include a specific feature, structure, or characteristic described in combination with the embodiment. Therefore, the phrases "in an embodiment", "in some embodiments", "in some other embodiments", "in other embodiments", etc. appearing in different places in the specification are not necessarily all refer to the same embodiment, but mean "one or more but not all embodiments" unless it is specifically emphasized otherwise. The terms "include", "comprise", "have" and their variations all mean "including but not limited to", unless specifically emphasized otherwise.

The above-mentioned embodiments are merely used to illustrate the technical solutions of the present application, and are not intended to limit the present application; although the present application has been described in detail with reference to the foregoing embodiments, those of ordinary skill in the art should understand that the foregoing technical solutions recorded in the examples can also be implement with modification, or with some of the technical features being equivalently replaced; these modifications or replacements do not cause the essence of the corresponding technical solutions to deviate from the spirit and scope of the technical solutions of the embodiments of the present application, and should be included within the protection scope of the present application.

What is claimed is:

1. A control circuit, comprising an airflow sensor, a power supply capacitor and a control chip, the control chip comprising a logic controller, a unidirectional conduction tube, a switch tube, a power supply pin, an atomization pin and a ground pin;
    wherein the logic controller is connected to a first end of the airflow sensor and a first end of the switch tube; the logic controller, through the power supply pin, is connected to a first end of the power supply capacitor and a second end of the switch tube; the logic controller, through the ground pin, is connected to a positive electrode of the unidirectional conduction tube, a second end of the airflow sensor and a second end of the power supply capacitor; and a negative electrode of the unidirectional conduction tube, through the atomizing pin, is connected to a third end of the switch tube;
    wherein the power supply pin and the atomization pin of the control chip are configured to connect with peripheral power supply module and atomization module to achieve an electronic atomization function.

2. The control circuit according to claim 1, characterized in that wherein,
    the power supply capacitor is configured to supply power to the control chip; the airflow sensor is configured to sense an intensity of airflow through the second end, and output an airflow intensity signal to the logic controller through the first end; the logic controller is configured to receive the airflow intensity signal output from the first end of the airflow sensor, control ON/OFF state of the switch tube according to the airflow intensity signal, and control a switch frequency and/or an on-duty ratio of the switch tube according to the airflow intensity signal to adjust a power of the atomization module; and wherein when a signal intensity of the airflow intensity signal is less than a preset value, the logic controller controls the switch tube to be in an OFF state; when the signal intensity of the airflow intensity signal is greater than or equal to the preset value, the logic controller controls the switch tube to be in an ON state.

3. The control circuit according to claim 2, wherein the switch tube is a P-type metal oxide semiconductor (MOS) tube; the first end of the switch tube is a gate, the second end is a source, and the third end is a drain;

alternatively, the switch tube is an N-type MOS tube; the first end of the switch tube is the gate, the second end is the drain, and the third end is the source.

4. The control circuit according to claim 1, wherein the control circuit further comprises an indicator light configured to indicate a use status and/or a power status; and wherein a positive electrode of the indicator light is connected to the logic controller, and a negative electrode of the indicator light is connected to the second end of the power supply capacitor.

5. The control circuit according to claim 4, wherein the indicator light is configured to receive a drive signal output by the logic controller, and adjust a brightness and/or flashing mode of the indicator light by pulse width modulation mode according to a voltage change of the drive signal.

6. An electronic atomization device, comprising a power supply module, an atomization module and the control circuit according to claim 1;

wherein a positive electrode of the power supply module is connected to the power supply pin of the control chip; a negative electrode of the power supply module, through the atomization module, is connected to the atomization pin of the control chip; and the negative electrode of the power supply module is grounded;

alternatively, the positive electrode of the power supply module, through the atomization module, is connected to the power supply pin of the control chip; the negative electrode of the power supply module is connected to the atomization pin of the control chip; and the negative electrode of the power supply module is grounded.

7. The electronic atomization device according to claim 6, wherein the switch tube in the control circuit is a P-type MOS tube, and the first end of the switch tube is a gate, the second end is a source, and the third end is a drain; alternatively, the switch tube is an N-type MOS tube, and the first end of the switch tube is the gate, the second end is the drain, and the third end is the source; and wherein the first end of the switch tube is connected to the logic controller; the second end of the switch tube is connected to the positive electrode of the power supply module through the power supply pin of the control chip; the third end of the switch tube, through the atomization pin of the control chip and the atomization module, is connected to the negative electrode of the power supply module;

alternatively, the first end of the switch tube is connected to the logic controller; the second end of the switch tube, through the power supply pin of the control chip and the atomization module, is connected to the positive electrode of the power supply module; the third end of the switch tube is connected to the negative electrode of the power supply module through the atomization pin of the control chip.

8. The electronic atomization device according to claim 6, wherein the airflow sensor is configured to sense an intensity of the airflow through the second end and output an airflow intensity signal to the logic controller and when a signal intensity of the airflow intensity signal is less than a preset value, the power supply module, the atomization module, the power supply capacitor and the unidirectional conduction tube form a first current path, the power supply capacitor is charged by the power supply module; and the power supply module, the atomization module, the logic controller and the unidirectional conduction tube form a second current path, the power supply module supplies power to the logic controller;

when the signal intensity of the airflow intensity signal is greater than or equal to the preset value, the power supply module, the atomization module and the switch tubed form a third current path, the atomization module adjusts an amount of tobacco tar atomization according to a switch frequency and/or an on-duty ratio of the switch tube; and the logic controller and the power supply capacitor form a fourth current path, the power supply capacitor supplies power to the logic controller.

9. The electronic atomization device according to claim 6, wherein the electronic atomization device further comprises a switch module, and the switch module is configured to control the electronic atomization device to switch between an enabled state and a disabled state in response to a user operation instruction to the switch module.

10. The electronic atomization device according to claim 6, wherein the electronic atomization device further comprises a casing and an electric control board; and wherein the control circuit is arranged on the electric control board, and the electric control board is accommodated in the casing.

11. A control circuit, comprising an airflow sensor, a power supply capacitor and a control chip, the control chip comprising a logic controller, a unidirectional conduction tube, a switch tube, a power supply pin, an atomization pin and a ground pin;

wherein the logic controller is connected to a first end of the airflow sensor and a first end of the switch tube; the logic controller, through the power supply pin, is connected to a first end of the power supply capacitor and a negative electrode of the unidirectional conduction tube; a positive electrode of the unidirectional conduction tube, through the atomization pin, is connected to a second end of the switch tube; the logic controller, through the ground pin, is connected to a third end of the switch tube, a second end of the airflow sensor and a second end of the power supply capacitor; and wherein the atomization pin and the ground pin of the control chip are configured to connect with a power supply module and an atomization module to achieve an electronic atomization function.

12. The control circuit of claim 11, wherein the power supply capacitor is configured to supply power to the control chip; the airflow sensor is configured to sense an intensity of airflow through the second end, and output an airflow intensity signal to the logic controller through the first end; the logic controller is configured to receive the airflow intensity signal output from the first end of the airflow sensor, control ON/OFF state of the switch tube according to the airflow intensity signal, and control a switch frequency and/or an on-duty ratio of the switch tube according to the airflow intensity signal to adjust a power of the atomization module; and wherein, when a signal intensity of the airflow intensity signal is less than a preset value, the logic controller controls the switch tube to be in an OFF state; when the signal intensity of the airflow intensity signal is greater than or equal to the preset value, the logic controller controls the switch tube to be in an ON state.

13. The control circuit according to claim 12, wherein the switch tube is a P-type metal oxide semiconductor tube; the first end of the switch tube is a gate, the second end is a source, and the third end is a drain;
   alternatively, the switch tube is an N-type MOS tube; the first end of the switch tubs is the gate, the second end is the drain, and the third end is the source.

14. The control circuit according to claim 11, wherein the control circuit further comprises an indicator light configured to indicate a use status and/or a power status;
   wherein a positive electrode of the indicator light is connected to the logic controller, and a negative electrode of the indicator light is connected to the second end of the power supply capacitor.

15. The control circuit according to claim 14, wherein the indicator light is configured to receive a drive signal output by the logic controller, and adjust a brightness and/or flashing mode of the indicator light according to a voltage change of the drive signal by pulse width modulation mode.

16. An electronic atomization device, comprising a power supply module, an atomization module and the control circuit according to claim 11;
   wherein a positive electrode of the power supply module, through the atomization module, is connected to the atomization pin of the control chip, a negative electrode of the power supply module is connected to the ground pin of the control chip, and the negative electrode of the power supply module is grounded;
   alternatively, the positive electrode of the power supply module is connected to the atomization pin of the control chip, the negative electrode of the power supply module, through the atomization module and is connected to the ground pin of the control chip, and the negative electrode of the power supply module is grounded.

17. The electronic atomization device according to claim 16, characterized in that, wherein the switch tube in the control circuit is a P-type MOS tube, and the first end of the switch tube is a gate, the second end is a source, and the third end is a drain; or, the switch tubed is an N-type MOS tube, and the first end of the switch tube is the gate, the second end is the drain, and the third end is the source; and
   wherein the first end of the switch tube is connected to the logic controller; the second end of the switch tube, through the atomization pin of the control chip and the atomization module, is connected to the positive electrode of the power supply module; and the third end of the switch tube, through the control chip ground pin, is connected to the negative electrode of the power supply module;
   alternatively, the first end of the switch tubed is connected to the logic controller; the second endue of the switch tube, through the atomization pin of the control chip, is connected to the positive electrode of the power supply module; and the third end of the switch tube, through the ground pin of the control chip and the atomization module, is connected to the negative electrode of the power supply module.

18. The electronic atomization device according to claim 16, wherein the airflow sensor is configured to sense an intensity of airflow through the second end and output an airflow intensity signal to the logic controller and when a signal intensity of the airflow intensity signal is lesser than a preset value, the power supply module, the atomization module, the power supply capacitor and the unidirectional conduction tube form a first current path, the power supply capacitor is charged by the power supply module; and the power supply module, the atomization module, the logic controller and the unidirectional conduction tube form a second current path, and the power supply module supplies power to the logic controller;
   when the signal intensity of the airflow intensity signal is greater than or equal to the preset value, the power supply module, the atomization module and the switch tube form a third current path, the atomization module adjusts an amount of tobacco tar atomization according to a switch frequency and/or an on-duty ratio of the switch tube; and the logic controller and the power supply capacitor form a fourth current path, the power supply capacitor supplies power to the logic controller.

19. The electronic atomization device according to claim 16, wherein the electronic atomization device further comprises a switch module, and the switch module is configured to control the electronic atomization device to switch between an enabled state and a disabled state according to a user operation instruction to the switch module.

20. The electronic atomization device according to claim 16, wherein the electronic atomization device further comprises a casing and an electric control board; and
   wherein the control circuit is arranged on the electric control board, and the electric control board is accommodated in the casing.

* * * * *